(12) United States Patent
Tada et al.

(10) Patent No.: US 8,592,303 B2
(45) Date of Patent: Nov. 26, 2013

(54) WIRING STRUCTURE AND METHOD FOR MANUFACTURING THE SAME

(75) Inventors: Munehiro Tada, Minato-ku (JP); Yoshihiro Hayashi, Minato-ku (JP); Yoshimichi Harada, Minato-ku (JP); Fuminori Ito, Minato-ku (JP); Hiroto Ohtake, Minato-ku (JP); Tatsuya Usami, Kawasaki (JP)

(73) Assignees: Renesas Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 12/715,088

(22) Filed: Mar. 1, 2010

(65) Prior Publication Data

US 2010/0151675 A1 Jun. 17, 2010

Related U.S. Application Data

(62) Division of application No. 10/558,367, filed as application No. PCT/JP2004/007791 on May 28, 2004, now Pat. No. 7,701,060.

(30) Foreign Application Priority Data

May 29, 2003 (JP) ................................ 2003-152743

(51) Int. Cl.
*H01L 21/4763* (2006.01)
(52) U.S. Cl.
USPC ........... 438/637; 438/597; 438/598; 438/618; 438/620; 438/622; 438/623; 438/624
(58) Field of Classification Search
USPC .......... 438/597, 598, 618, 620, 622–624, 637
See application file for complete search history.

(56) References Cited

U.S. PATENT DOCUMENTS 6,723,635 B1 4/2004 Ngo et al.
6,787,452 B2 * 9/2004 Sudijono et al. .............. 438/637

(Continued)

FOREIGN PATENT DOCUMENTS

JP 9275138 A 10/1997
JP 2000-174019 A 6/2000

(Continued)

OTHER PUBLICATIONS

Tada, M., et al. "Barrier-Metal-Free (BMF), Cu Dual-Damascene Interconnects With Cu-epi-Contacts Buried in Anti-Diffusive, Low-k Organic Film," 2001 Symposium on VLSI Technology, Jun. 12, 2001, pp. 13-14.

(Continued)

*Primary Examiner* — Bac Au
(74) *Attorney, Agent, or Firm* — Sughrue Mion, PLLC

(57) ABSTRACT

There are provided with a wiring structure and a method for manufacturing the same wherein in a wiring structure of multi-layered wiring in which a metal wiring is formed on a substrate forming a semiconductor element thereby obtaining connection of the element, no damage to insulation property between the abutting wirings by occurrence of leakage current and no deterioration of insulation resistance property between the abutting wirings are achieved in case that fine metal wiring is formed in a porous insulation film. The insulation barrier layer 413 is formed between an interlayer insulation film and the metal wiring, in the metal wiring structure on the substrate forming the semiconductor element. The insulation barrier layer enables to reduce leakage current between the abutting wirings and to elevate the insulation credibility.

7 Claims, 61 Drawing Sheets

(56) References Cited

U.S. PATENT DOCUMENTS

| | | |
|---|---|---|
| 6,972,453 B2 | 12/2005 | Ohtake et al. |
| 7,101,591 B2 | 9/2006 | Hayashi et al. |
| 7,132,363 B2 | 11/2006 | Yang et al. |
| 2001/0051420 A1 | 12/2001 | Besser et al. |
| 2002/0137276 A1 | 9/2002 | Park |
| 2002/0185671 A1 | 12/2002 | Kim |
| 2003/0001282 A1 | 1/2003 | Meynen et al. |
| 2004/0115910 A1 | 6/2004 | Passemard et al. |
| 2004/0222527 A1 | 11/2004 | Dostalik et al. |

FOREIGN PATENT DOCUMENTS

| | | |
|---|---|---|
| JP | 2000-183166 A | 6/2000 |
| JP | 2000-294634 A | 10/2000 |
| JP | 2001-007204 A | 1/2001 |
| JP | 2001-332543 A | 11/2001 |
| JP | 2002-009078 A | 1/2002 |
| JP | 2002-011869 A | 1/2002 |
| JP | 2002-064140 A | 2/2002 |
| JP | 2002-083870 A | 3/2002 |
| JP | 2003-068850 A | 3/2003 |
| JP | 2003-347290 A | 12/2003 |
| JP | 2003-347403 A | 12/2003 |
| JP | 2004-006748 A | 1/2004 |
| JP | 2004-193326 A | 7/2004 |
| JP | 2004-200203 A | 7/2004 |
| WO | 01/54190 A1 | 7/2001 |
| WO | 02/058134 A1 | 7/2002 |

OTHER PUBLICATIONS

Tada, M., et al. A 65nm-Node Cu Interconnect Technology Using Porous SiOCH Film (K=2.5) Covered With Ultra-Thin, Low-k Pore Seal (k=2.7), International Electron Devices Meeting 2003 Technical Digest, Dec. 8-10, 2003, pp. 35.2.1 to 35.2.4.

Chinese Office Action issued in corresponding Chinese Patent Application No. 2004800212527, dated Oct. 19, 2007.

\* cited by examiner impossible to form by coating method lowering of cross sectional area

412

1307

2906

2907

WIRING STRUCTURE AND METHOD FOR MANUFACTURING THE SAME

CROSS REFERENCE TO RELATED APPLICATIONS

This application is a divisional of U.S. patent application Ser. No. 10/558,367, filed Nov. 29, 2005, which is a national stage of International Application No. PCT/JP2004/007791, filed May 28, 2004, claiming priority based on Japanese Patent Application No. 2003-152743, filed May 29, 2003, the contents of all of which are incorporated herein by reference in their entirety.

FIELD OF THE INVENTION

The present invention relates to a multi-layered wiring structure of a semiconductor device and a method for manufacturing the same, more in detail, to the multi-layered wiring structure constituted by a trench wiring structure (damascene wiring) in which a film with dielectric constant lower than a silicon oxide film is used as an interlayer insulation film, and the method for manufacturing the same.

DESCRIPTION OF THE RELATED ART

For the purpose of fully describing the level of technology at present, all of each description on the patents, patent applications, patent publications and the scientific papers cited or specified in the present application will be incorporated herein referring to them.

Conventionally, aluminum or aluminum alloy is broadly used as the electrically conductive material in a semiconductor large-scale integrated circuit. Also, a silicon oxide film ($SiO_2$) is broadly used as an insulation film between wirings and an interlayer insulation film.

Then, in accordance with miniature of manufacturing process it has been required to suppress or reduce delay of signal transmission in the wiring. To this end a copper (Cu) has been used as the electrically conductive material having a low wiring resistance.

Further a silicon oxide film including low dielectric constant material and pores in an insulation film between wirings and an interlayer insulation film has been used to reduce parasitic capacity between wirings.

However, it is known in the wiring having copper as a main component that diffusion of Cu in the insulation film including silicon (Si) and a silicon oxide film is faster than Al.

From here onwards, it is necessary to form a diffusion barrier film, so that penetration of Cu into a semiconductor element including a transistor, deterioration of the dielectric strength voltage and so on are prevented, thereby securing credibility to the semiconductor element.

In forming the damascene wiring structure using Cu, simplification and cost down of the process are necessary. In addition, the practical application of the dual damascene wiring and the process for interlayer insulation film with a low dielectric constant using dual hard masks are proposed.

The above mentioned multi-wiring structures, for instance, are disclosed in Japanese laid open patents (unexamined) 2002-11869 (FIG. 4) and 2001-007204 (FIG. 3).

Then, in the following, the conventional damascene wiring will be explained referring to the drawings. First, the conventional type of an oxide film dual damascene wiring is explained as the first embodiment.

On a SiN film 801 of a substrate (not shown) forming a semiconductor element thereon, as illustrated in FIG. 1A, there is provided with an under-layered wiring having a $SiO_2$ film 802, a Cu film 803 and a Ta/TaN film 804. Further on the under layer wiring there are provided with a SiN film 805, a $SiO_2$ film 806, SiON film 807, and a $SiO_2$ film 808 in the order of description.

Then, as illustrated in FIG. 1B, a dual damascene trench 809 is formed using photo resist and reactive ion etching.

As to forming processes of the dual damascene trench, a via first process and a trench first process are well known. The via first process is a process forming a trench pattern in which the via is opened at first and then photo resist is coated on the upper surface of the opened via. On the other hand, the trench first process is a process forming a via pattern in which the trench is opened at first and then photo resist is coated on the upper surface of the opened trench.

Then, as illustrated in FIG. 1C, a Ta/TaN film 810 with 30 nm in thickness is deposited on the whole surface by the PVD (Physical Vapor Deposition) method. Then, a Cu seed layer with 100 nm in thickness is deposited by sputtering process without air exposure as it were. Then, Cu is deposited by the electrolytic plating method, and then a Cu embedding 811 is formed by heat treatment for 5 to 30 minutes in a range of temperatures at 200 to 400

Then, as illustrated in FIG. 1D, surplus Cu is removed (Cu-CMP) by grinding through CMP (Chemical Mechanical Polishing) method, and a second Cu wiring 812 is formed.

To form electrically conductive barrier layers used for these damascene processes, metal such as titan (Ti) and tantalum (Ta) and its nitride with comparatively high melting points, or their layer stack are used because these used in barrier layers have high preventive performance to Cu diffusion, good adhesion between undercoat insulating material and a Cu wiring portion, and thermal stability in the process and so on.

In the first conventional embodiment provided with those structures, miniature wiring is necessary, in which both of wiring width and diameter of via holes are less than 0.1 μm, in accordance with the scaling down of LSI. Particularly, increase of capacitance between wirings has become a serious problem that causes wiring delay, increase of the cross talk and increase of the electric power consumption. Accordingly, it is desired to reduce capacitance between wirings by means of replacing the interlayer insulation film $SiO_2$ with low dielectric constant material.

The semiconductor device thus manufactured includes a following problem. In the first conventional embodiment, the side surface and the wiring bottom where Cu wiring is formed, is overlaid by a barrier metal film having resistance properties to Cu diffusion, that is indicative of preventing Cu diffusion into the insulation film and achieving high credible wiring.

Many kinds of material conventionally used for the barrier metal film are formed through the PVD method typified by the sputtering process as mentioned above. However, scaling down of wiring trench width and diameter of the via hole in accordance with miniaturization of the semiconductor element, makes difficult to uniformly deposit the barrier metal in thickness on the wiring side surface, wiring bottom, the side surface of the via hole and the bottom of the via hole. Namely, it has been desired to form the barrier metal film using a process other than PVD method.

The general solution to this problem in the field of the technology is to form the barrier metal film by means of the CVD (Chemical Vapor Deposition) method or ALCVD (Atomic Layer Chemical Vapor Deposition) method. Through the above methods a technique is used that makes possible to improve coverage in the barrier metal film and to form the barrier metal uniformly to the microscopic wiring trench and via hole. Those forming methods make it possible that a barrier metal layer with high quality is deposited uniformly in the wiring trench and via hole.

On the other hand, introduction of the film with porous and low dielectric constant to the interlayer insulation film is underway. In order to connect or switch semiconductor elements at high speed and low electric power using multi-layered wiring, it is effective not only to miniaturize, but also to make the interlayer film with low dielectric constant. Therefore it is required to satisfy both of them.

For reducing the effective capacitance between wirings it has been requested to lower the dielectric constant in the interlayer insulation film (silicon oxide film in this case (k=4, 2)). The low dielectric constant films are, for instance, HSQ (Hydrogen Silsesquioxane) film, MSQ (Methyl Silsesquioxane) film, CDO (carbon Doped Oxide) film or porous film of them, which are formed by the rotary coating process or the CVD method.

These low dielectric constant films have a feature of low density, in which a pore opening is more than 1 nm. In case that the wiring is formed through forming a wiring trench or a via hole in the low dielectric constant film and then embedding a metal wiring, there causes a problem that liquid, gas or dissimilar metal easily penetrates from the wiring trench or the side surface of the via hole into the insulation film.

Thus, in the case of forming the metal wiring through embedding porous insulation films, the following serious problems may occur.

First, because of having irregularity of the pore hole exposed on the side surface, discontinuity of the barrier metal is induced so that diffusion of Cu occurs, and as the result there occurs a problem that insulation credibility of the porous insulation film deteriorates.

Second, in case that for instance, an electrically conductive barrier metal is deposited using a process utilizing reaction by gas as in the CVD process mentioned above, raw material of the gas easily penetrates from the wiring trench or the side surface of the via hole into the porous insulation film, so that the barrier metal layer supposed to be formed in the trench or the side surface of the via hole separates out inside the insulation film, and as the result there occurs a problem that leakage current, insulation resistance property and insulation credibility deteriorates.

Third, in case that the low dielectric constant film has porous property, moisture, gas and dissimilar metal outside easily penetrates from the wiring trench or the side surface of the via hole into the porous insulation film, and as the result there occurs a problem that insulation credibility of the porous insulation film deteriorates.

Though the conventional technology to such the problems approaches to barrier the side surface of the porous insulation film with an insulation film, there are still problems in the conventional technology which will be described in more detail referring to FIGS. 2A to 2F.

There are the following problems in the semiconductor device utilizing a technology (refer to FIG. 2A) which barriers the side surface of the porous insulation film with non-porous insulation film.

(1) First, in case of forming an insulation film on the side surface of the porous insulation film and further using inorganic substance as the insulation film overlaying the side surface, the relative dielectric constant of the inorganic substance, which is generally in the vicinity of 4.0, is larger compared with that of the porous insulation film. Accordingly, there is a problem that capacitance between wirings increases when only using a material with the relative dielectric constant high (refer to FIG. 2B). One of the typical technical documents including such a problem is, for instance, Japanese laid open (unexamined) patent 2002-64140. So, there has been desired a technology enabling to barrier the side surface of the porous insulation film without increasing capacitance between wirings.

(2) Second, in case of forming an insulation film on the side surface of the porous insulation film, it was difficult to form organic substance with low dielectric constant. Generally, the organic substance is often formed on a substrate by means of the rotary coating process. However, in case of the technology about polyimide described in, for instance, Japanese laid open patent 2001-332543, and the organic substance described in Japanese laid open patent 2003-347290, it was difficult to uniformly and with well coverage form the organic substance with degree of 10 nm in thickness on the side surface of the wiring trench or the via hole (refer to FIG. 2C). Accordingly, there has been desired a technology enabling to form the organic substance which suppresses to increase capacitance between wirings on the side surface of the wiring trench or the via hole uniformly with less than 10 nm in thickness.

(3) Third, in case of forming an insulation film on the side surface of the porous insulation film, there was a problem that it was difficult to form the organic substance only on the side surface and to form fine wiring configuration with high control performance. For instance, in the technology described in Japanese laid open patent 2004-6748, there are problems that the porous film damages, and the organic substance is eliminated during the reactive ion etching (refer to FIG. 2D) when securing connection with the under-layered wirings, so it was very difficult to actually apply to the side surface of the fine wiring with less than 100 nm in width. Accordingly, there has been desired a technology enabling to form a wiring configuration with high control performance in the ultra fine wiring and to fully barrier the side surface of the porous insulation film with the insulation film.

Fourth, in case of forming an insulation film on the side surface of the porous insulation film, there was a problem that the sectional area reduces and as the result wiring resistance increases, because an insulation film is formed on the bottom of the wiring trench as well as the side surface when fully protecting the side surface of the porous insulation film (refer to FIG. 2E). Typical technical documents including such a problem are, for instance, Japanese patent No. 003323005 and Japanese laid open patent (unexamined) 2003-668850. So, there has been desired a technology enabling to form the insulation film only on the side surface of the wiring trench or via hole with high control performance.

(5) Fifth, in case of forming an insulation film on the side surface of the porous insulation film and further utilizing a fluorocarbon film and etc. described in Japanese laid open patent 2000-174019 as the insulation film overlaying the side surface, there was a problem that adhesiveness between the metal wiring and the porous film reduces because of generating degasification from inside the films (refer to FIG. 2F). So, there has been desired a technology enabling to barrier the side surface of the porous insulation film without reducing adhesiveness between the metal wiring and the porous film.

SUMMARY OF THE INVENTION

Accordingly, the present invention is to provide a metal wiring structure and a method for manufacturing the same, wherein the metal wiring structure prevents diffusion of Cu into a porous insulation film, holds leakage current between the wirings at a low level, keeps insulation credibility to be high and constitutes high integrated circuit with high credibility by overlaying a side surface of the metal wiring with an insulation barrier layer when a fine metal wiring having Cu as a main component is formed inside the porous insulation film.

The first aspect of the present invention is to provide a wiring structure wherein the wiring structure is so constituted that, in a wiring structure of multi-layered wiring in which a plurality of unit wiring structures are laminated, the unit wiring structure having at least one metal wiring and at least one metal connection plug formed by filling the metal into a wiring trench and a via hole formed in an insulation film on a substrate forming a semiconductor element, at least one of the unit wiring structures includes an insulation barrier layer with organic substance inserted between at least one of the metal wiring and the metal connection plug, and an interlayer insulation film, at least a portion of a side surface of at least one of the metal wiring and the metal connection plug being overlaid by the insulation barrier layer.

The insulation barrier layer can further include a silicon atom.

The metal can be copper, the metal wiring can be a copper wiring and the metal connection plug can be a copper connection plug.

An interlayer insulation film in which a first insulation film, a porous insulation film and a second insulation film are laminated in series, is formed on at least one of the copper wiring and the copper connection plug, at least a portion of a side surface of at least one of a wiring trench and a via hole formed through the first insulation film, the porous insulation film and the second insulation film being overlaid by the insulation barrier layer including the organic substance, and carbon content of the organic substance being preferably larger than that of the first insulation film and the second insulation film.

An interlayer insulation film in which a first insulation film, a third insulation film, a fourth insulation film, a porous insulation film and a second insulation film are laminated in series, is formed on the copper wiring, at least a portion of, a side surface of a wiring trench formed through at least the second insulation film and the porous insulation film and a side surface of a via hole formed through the fourth insulation film, a via interlayer insulation film and the first insulation film being overlaid by the insulation barrier layer including the organic substance, and carbon content of the organic substance being preferably larger than that of the first insulation film, the second insulation film and the fourth insulation film. The insulation barrier layer can further include silicon atoms. It is preferable to include silicon atoms in the insulation barrier layer including the organic substance in the range smaller than that of the first insulation film, the second insulation film and the fourth insulation film.

It is preferable that relative dielectric constant of the porous insulation film is no greater than 3.0.

It is preferable that the third insulation film and the fourth insulation film are made of the same material.

It is preferable that the insulation barrier layer including the organic substance is made of organic substance including Si—O binding.

It is preferable that the insulation barrier layer including the organic substance is organic substance including silicon in the range of 1 atm % to 10 atm %.

It is preferable that the insulation barrier layer including the organic substance is made of a film of Divinyl Siloxane Benzo Cyclobutene.

It is preferable that the insulation barrier layer including the organic substance is made of a film of Divinyl Siloxane Benzo Cyclobutene, the first insulation film is made of a SiCN film, the second insulation film is made of a $SiO_2$ film and the porous insulation film is made of a porous SiOCH film.

It is preferable that the insulation barrier layer including the organic substance is made of a film of Divinyl Siloxane Benzo Cyclobutene, the first insulation film is made of a SiCN film, the second insulation film is made of a $SiO_2$ film, the porous insulation film is made of a porous SiOCH film, the third insulation film is made of a porous SiOCH film and the fourth insulation film is made of a $SiO_2$ film.

It is preferable that the insulation barrier layer including the organic substance is made of a film of Divinyl Siloxane Benzo Cyclobutene, the first insulation film is made of a SiCN film, the second insulation film is made of a $SiO_2$ film, the porous insulation film is made of a porous SiOCH film, the third insulation film is made of a nonporous SiOCH film and the fourth insulation film is made of a $SiO_2$ film.

It is preferable that the insulation barrier layer including the organic substance is made of carbon, silicon and organic substance.

It is preferable that the first insulation film and the second insulation film are made of the same material.

It is preferable that the first insulation film and the second insulation film are made of the same material and made of either one of SiCN, SiC, SiCNH, SiCH and SiOCH.

The second aspect of the present invention is to provide a wiring structure wherein the wiring structure is so constituted that, in a wiring structure with a multi-layered wiring formed in an insulation film on a semiconductor substrate, which is provided with a metal wiring including Cu as a main component formed through a porous insulation film and a second insulation film laid on the porous insulation film, and a first insulation film formed on the second insulation film, the first insulation film and the second insulation film, are made of the same material.

It is preferable that the same material constituting the first insulation film and the second insulation film is made of either one of material including silicon carbide as a main component, material including silicon nitride as a main component and material including silicon carbonitride as a main component.

The third aspect of the present invention is to provide a method for manufacturing a multi-layered wiring in which a plurality of unit wiring structures are laminated, the unit wiring structure having a wiring and a connection plug formed by filling metal including Cu as a main component into a wiring trench and a via hole formed in an insulation film on a substrate forming a semiconductor element, the method including the processes of, a process for forming a first insulation film directly contacting on the copper wiring or the copper connection plug and a porous insulation film laid on the first insulation film, a process for forming a second insulation film laid on the porous insulation film, a process for forming a wiring trench or a via hole in the second insulation film and the porous insulation film, a process for forming an insulation barrier layer including organic substance at upper surface, side surface and bottom surface of a wiring structure sectioned by the wiring trench or the via hole, a process for etching back the insulation barrier layer including organic substance and removing the insulation barrier layer including organic substance remaining on the upper surface and bottom surface portions of the wiring structure, and a process for embedding a metal film in the wiring structure trench or the via hole.

It is preferable that the insulation barrier layer including organic substance is formed by the plasma polymerization method.

The fourth aspect of the present invention is to provide a method for manufacturing a multi-layered wiring in which a plurality of unit wiring structures are laminated, the unit wiring structure having a wiring and a connection plug formed by filling metal including Cu as a main component into a wiring trench and a via hole formed in an insulation film on a substrate forming a semiconductor element, the method including the processes of, a process for forming a first insulation film, a third insulation film, a fourth insulation film, a porous insulation film and a second insulation film by laminating in series on a copper wiring, a process for forming a wiring trench in the porous insulation film and the second insulation film, a process for forming a via hole in the third insulation film and the fourth insulation film, a process for forming an insulation barrier layer including organic substance at upper surface, side surface and bottom surface of the wiring structure sectioned by the wiring trench and the via hole, a process for etching back the insulation barrier layer including organic substance and removing the insulation barrier layer including organic substance remaining on the upper surface and bottom surface of the wiring structure, a process for removing the first insulation film on the bottom of the via hole in the wiring structure, and a process for embedding a metal film in the wiring trench and the via hole.

It is preferable that the insulation barrier layer including organic substance is formed by the plasma polymerization method.

The following improvement of the technology can be achieved by applying the present invention constituting the (multi-layered) wiring structure and the method for manufacturing the same mentioned above.

(1) First, in the wiring structure of the type with copper embedded in which the fine wiring trench or the via hole formed in the porous insulation film is filled, multi-layered wiring with high insulation property and insulation credibility can be obtained by overlaying the side surface of the porous insulation film with the insulation barrier layer including organic substance.

(2) Second, the processing performance of the wiring trench in utilizing the reactive ion etching is improved, and makes it possible to easily form the insulation barrier layer uniformed only to the side surface, by means of controlling composition so as to include silicon and include carbon much more in the range less than the first insulation film, the second insulation film and the fourth insulation film in the insulation barrier layer overlaying the side surface of the wiring. As the result, the multi-layered wiring can be obtained with improved performance in preventing diffusion of copper and high credibility to dielectric strength voltage.

(3) Third, the adhesiveness between the porous insulation film and the metal wiring can be held at high level by overlaying the side surface of the porous insulation film with the insulation barrier layer. As the result, the multi-layered wiring can be obtained, which has high resistance to electro migration of Cu wiring and stress migration.

(4) Fourth, the insulation barrier layer made of organic substance and having an ultrathin film no greater than 10 nm in film thickness can be easily formed with well coverage by utilizing the plasma polymerization method when forming the insulation barrier layer on the side surface of the porous insulation film. As the result, increase of effective capacitance between wirings can be prevented, and both of wiring performance and credibility of wiring insulation can be satisfied.

(5) Fifth, because penetration of raw material of gas into the insulation film is suppressed by overlaying the side surface of the porous insulation film with the insulation barrier layer, it is possible to uniformly deposit the barrier metal with high quality using the CVD or ALCVD method even in the fine wiring no greater than 0.1 nm.

(6) Sixth, by using the same material for forming the first insulation film and the second insulation film, leakage current between wirings reduces and consequently the multi-layered wiring with high dielectric property between wirings can be obtained.

In accordance with the present invention mentioned above, damascene wiring structure using the porous insulating material with low dielectric constant is easily formed, and is fully applicable to mass production. Also, it is possible to easily manufacture the multi-layered wiring structure having a fine structure, high performance and high credibility.

BEST MODE FOR CONDUCTING THE PRESENT INVENTION

Figure 1A:
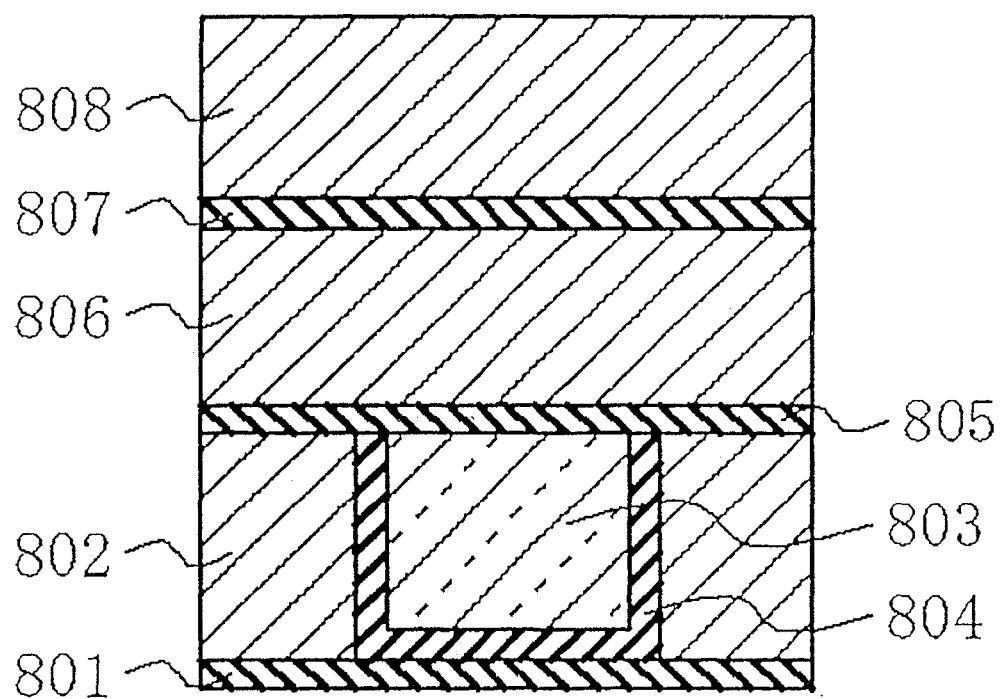
FIGS. 1A to 1D are partial and vertical cross sectional views showing a series of processes in a first conventional method for manufacturing a semiconductor device.
Figure 1B:
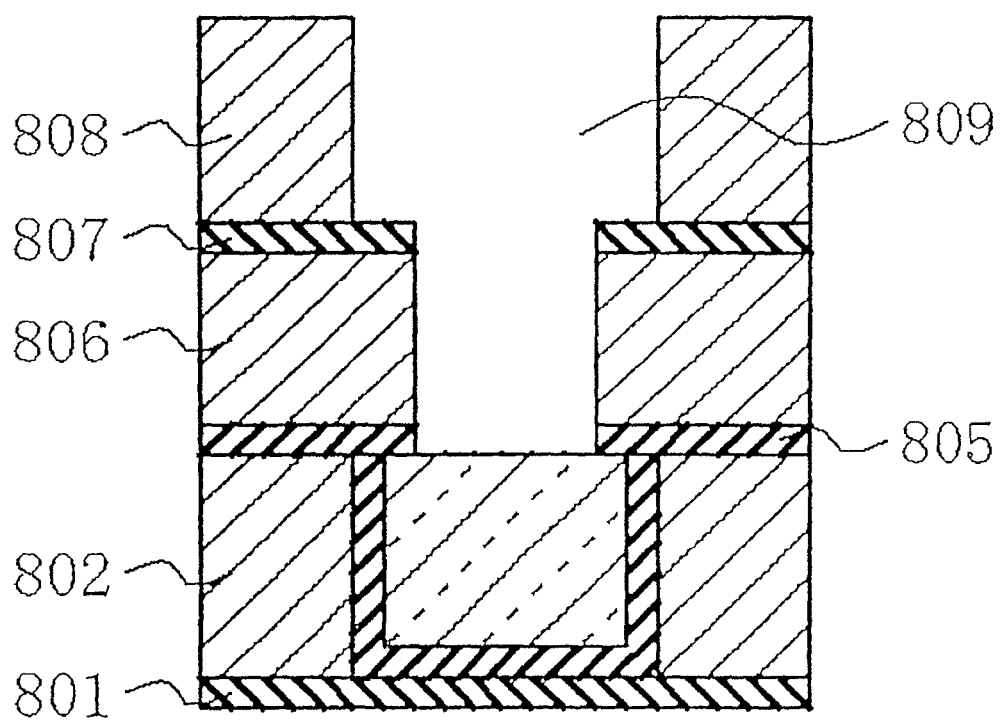
Figure 1C:
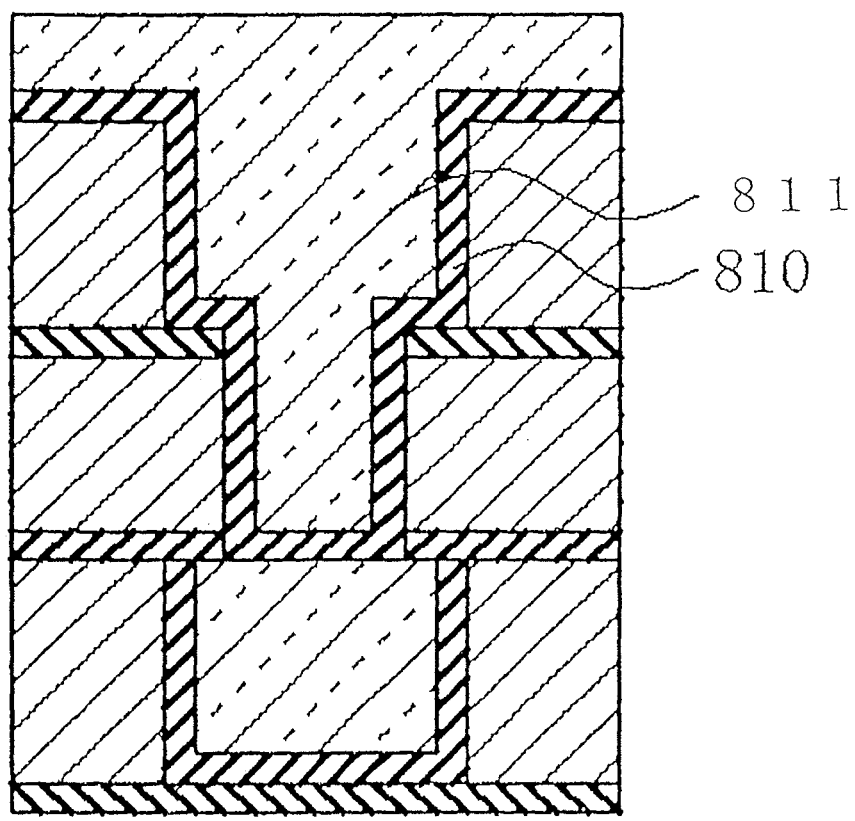
Figure 1D:
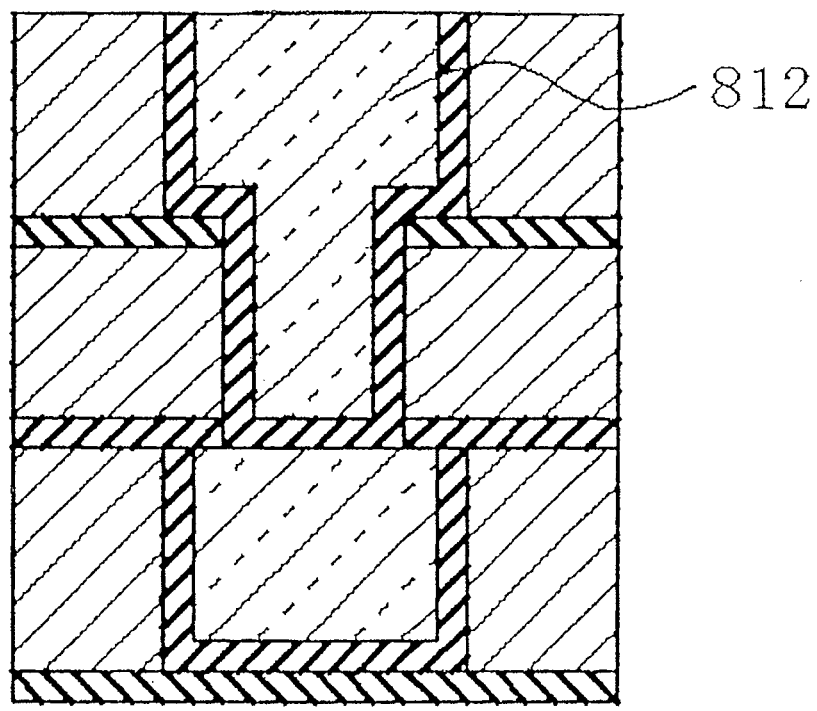
Figure 2A:
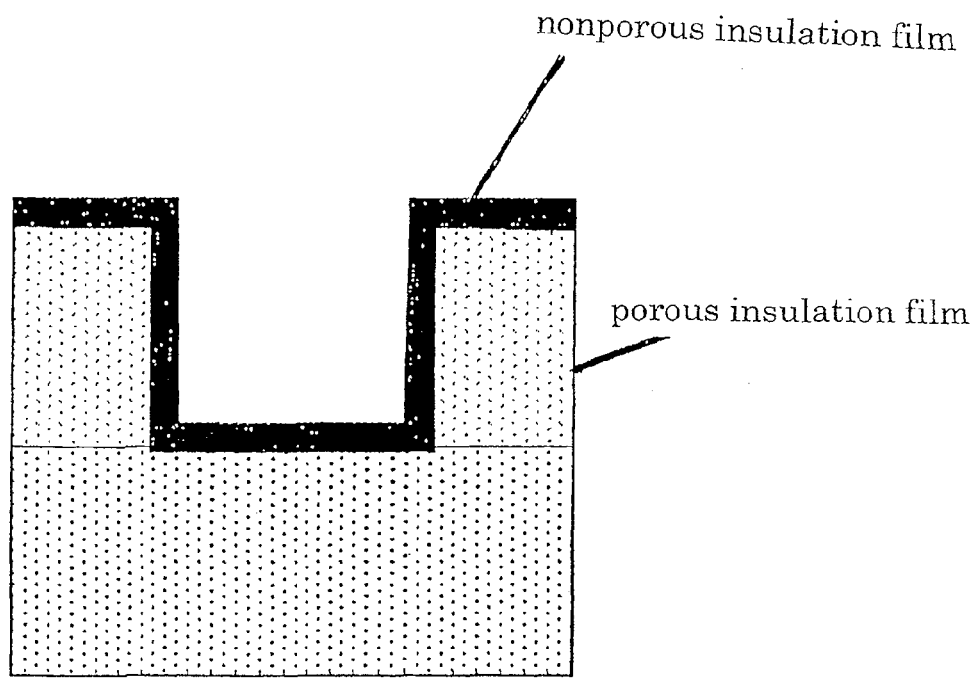
FIGS. 2A to 2F are partial and vertical cross sectional views of a semiconductor device for explaining problems in a conventional semiconductor device.
Figure 2B:
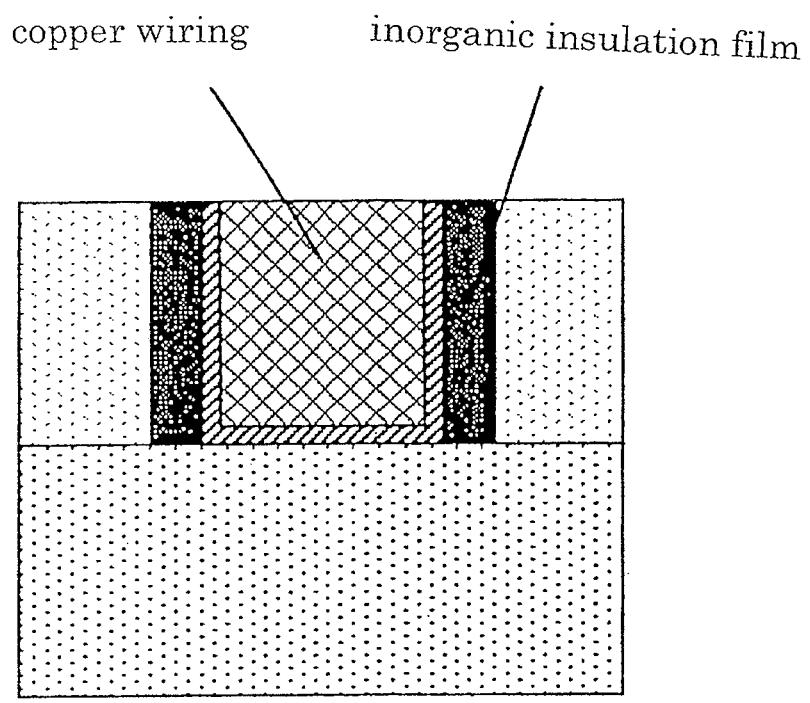
Figure 2C:
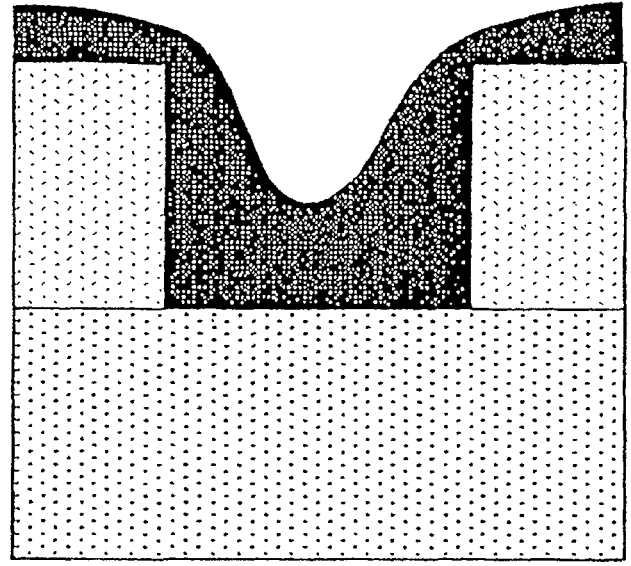
Figure 2D:
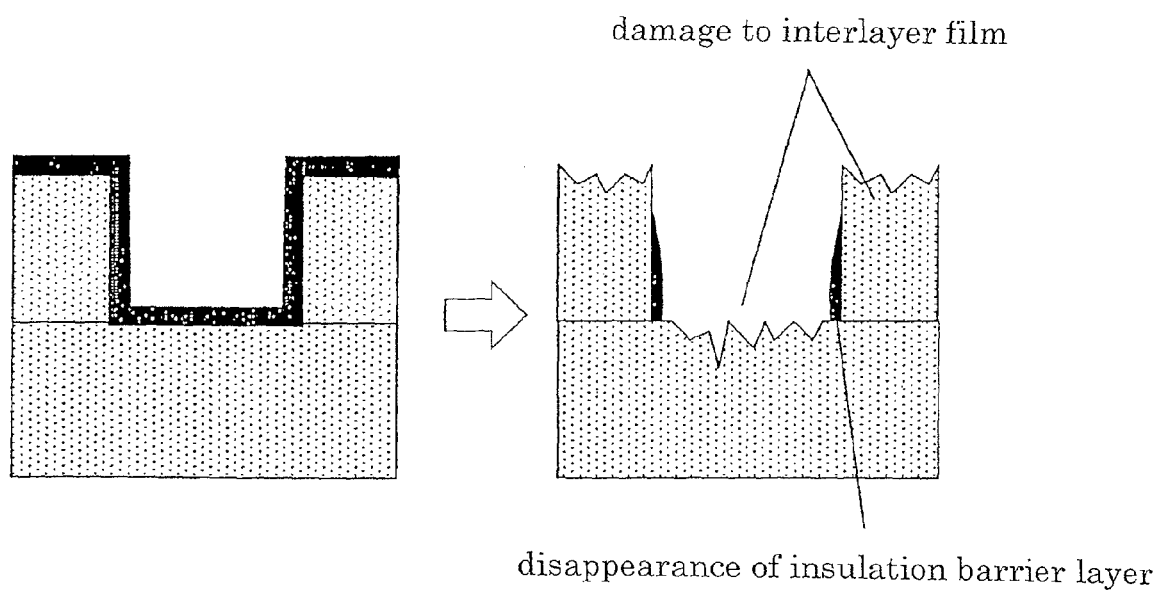
Figure 2E:
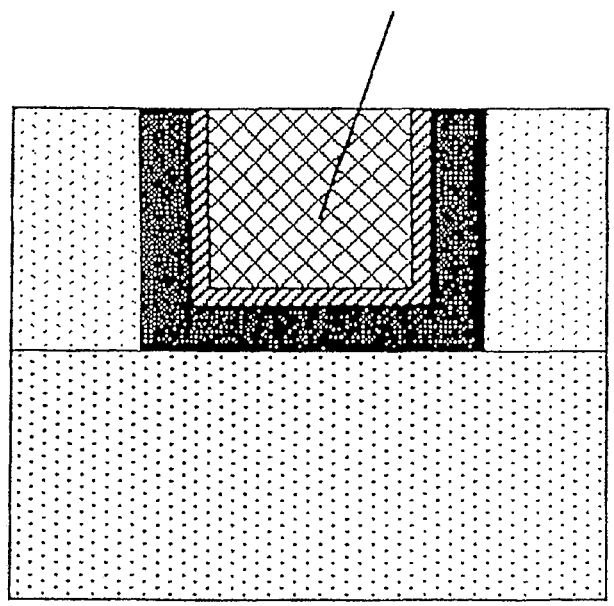
Figure 2F:
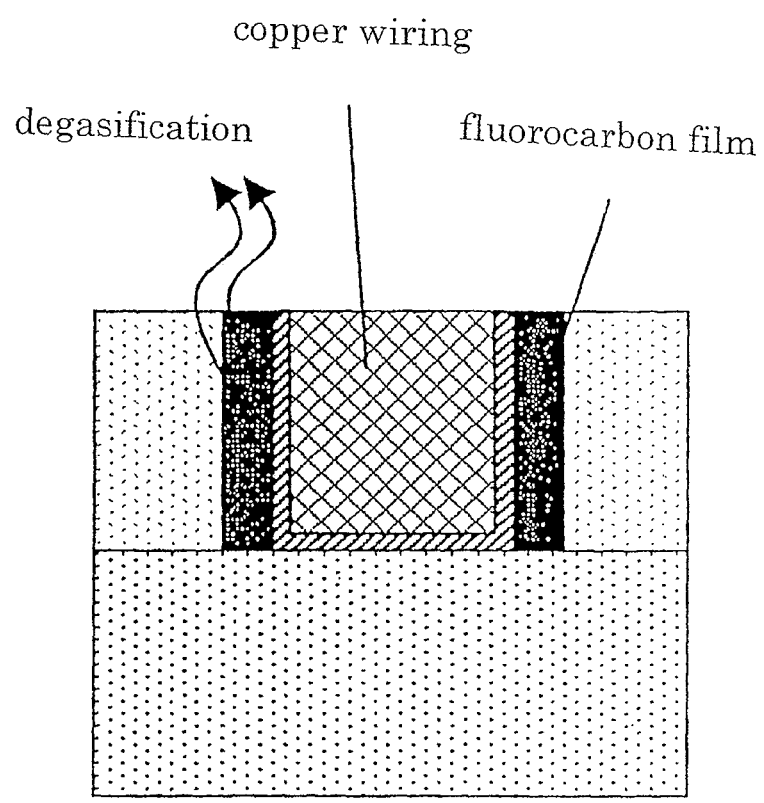

Then, the embodiments of the present invention will be described in detail referring to the drawings.

(First Embodiment)

Now, a wiring structure on the first embodiment of the present invention will be described. FIGS. 3A to 3F are partial and vertical cross sectional views showing a series of processes in a method for manufacturing a semiconductor device in accordance with a first embodiment of the present invention.

Figure 3A:
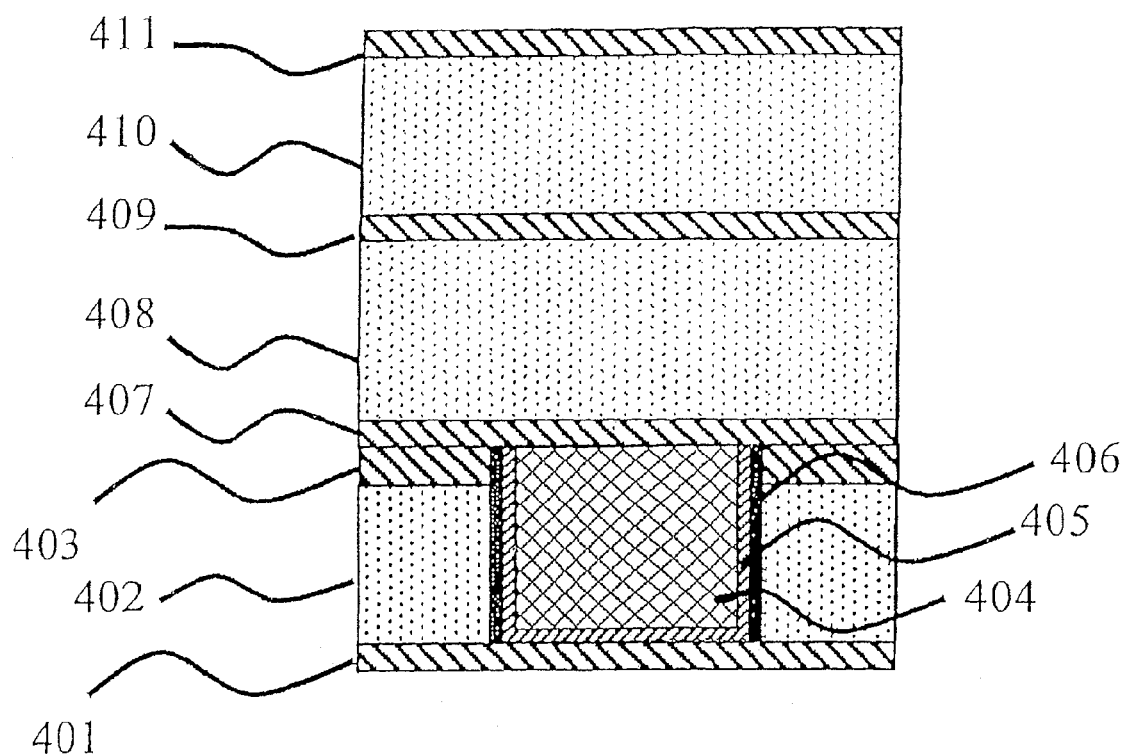
FIGS. 3A to 3F are partial and vertical cross sectional views showing a series of processes in a method for manufacturing a semiconductor device in accordance with a first embodiment of the present invention.

As illustrated in FIG. 3A, in the wiring structure in accordance with the first embodiment of the present invention, there is formed a Cu wiring structure on a etch stop film 401 of a fourth insulation film laid on a substrate (not shown) forming a semiconductor element. The Cu wiring structure is constituted by a porous insulation film 402, a hard mask 403 of a second insulation film, a insulation barrier layer 406 and a first Cu wiring 404 enclosed by a barrier metal film 405.

Further there is formed a first insulation film 407. Then, there is laminated a via interlayer insulation film 408 of a third insulation film on the first insulation film 407, and on the via interlayer insulation film 408 a fourth insulation film 409 is deposited. A porous insulation film 410 is deposited on the fourth insulation film 409, and on the porous insulation film 410 a second insulation film 411 is deposited.

In the case, the first insulation film 407 has a role of a cap film preventing oxidation of the Cu wiring, and the film 407 is made of at least one or more layers of silicon carbide, compound of them, organic compound including carbon or hydrogen in the compound of them or compound laminating them, and in some cases it may include oxygen. The film 407 is, for example, made of SiC, SiCN, SiNH, SiCNH and so on.

The fourth insulation films 401 and 409 have a role of etch stop.

The films 401 and 409 are, for example, made of $SiO_2$ film, SiC film, SiCN film and SiOCH film.

The second insulation films 403 and 411 have a role of hard mask film which protects the porous insulation film when etching and Cu-CMP. The films 403 and 411 are, for example, made of $SiO_2$ film, SiC film, SiCN film and SiOCH film.

In the description below, the first insulation film, the fourth insulation film and the second insulation film are inscribed on the surface such as a cap film, an etch stop film and a hard mask film respectively, in accordance with each role.

The insulation barrier layer 406 is made of a layer of organic substance, a layer including silicon, carbon and organic substance, a layer of organic substance including Si—O binding, a layer of organic substance including silicon in the range of 1 atm % to 10 atm %, and so on. It may be, for example, made of a film of organic substance formed by the plasma polymerization method or formed by the plasma polymerization method using DVS-BCB as raw material, such as BCB (Benzocyclobutene: hereinafter called as BCB). This is described in detail later referring to FIG. 3C. In addition, the chemical formula shown here does not reflect ratio of the chemical composition.

Also, it is preferable that the porous insulation films 402 and 410 are at least one or more porous films with a low dielectric constant, for example, the relative dielectric constant being 2.0 to 3.0. The typical examples of such films are a HSQ (hydrogen Silsesquioxane) film, a MSQ (Methyl Silsesquioxane) film (for example, JSR-LKD™, ALKAP™, IPS™, HOSP™), an organic polymer film (SiLK™, Flare™), or SiOH, SiOC (for example, Black Diamond™, CORAL™, AuroraULK™, Orion™ and so on), or an insulation film including organic substance in them, or a film with the porosity rate increased by adjusting the forming condition, for example, the substrate temperature or composition of the raw material in case that the porosity rates of those films are less than the desired values.

Also, it is preferable that the via interlayer insulation film 408 is at least one or more films with a low dielectric constant, for example, the relative dielectric constant being 2.0 to 3.0. However, the via interlayer insulation film 408 is not necessary to be porous in case that enough low capacitance between wirings can be obtained by the porous insulation films 402 and 410. Accordingly, the typical examples of the via interlayer insulation film 408 are a HSQ (hydrogen Silsesquioxane) film, a MSQ (Methyl Sisesquioxane) film (for example, JSR-LKD™, ALKAP™, IPS™, HOSP™), a organic polymer film (SiLK™, Flare™), or SiOH, SiOC (for example, Black Diamond™, CORAL™, AuroraULK™, Orion™ and so on), or an insulation film including organic substance in them, or a film with the porosity rate adjusted by adjusting the forming condition, for example, the substrate temperature or composition of the raw material in case that the porosity rate of those films are not the desired values.

According to need, in the porous insulation film 402 and 41, and the via interlayer insulation film 408, there maybe laminated or inserted, or may have a compositional distribution in the direction of the film thickness such as a silicon oxide film, a silicon nitride film, a silicon carbide film or a silicon carbonitride film formed by the CVD process.

Also, the first Cu film 404 is made of metal including Cu as a main component, and it may includes, according to need, dissimilar metal such as Ti, Sn, Zn, AL, or it may be inserted by Ta, Ti, W, Si and nitrogen compound of them or laminated film of them (not shown) with a given method.

Figure 3B:
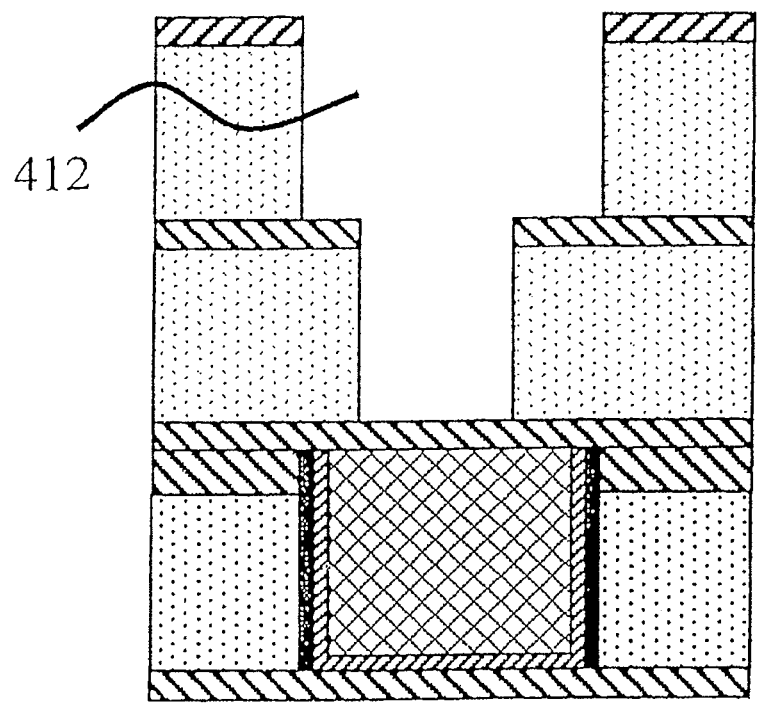

Then, as illustrated in FIG. 3B, a dual damascene wiring trench 412 is formed in the interlayer insulation film using photo resist and reactive ion etching.

Figure 3C:
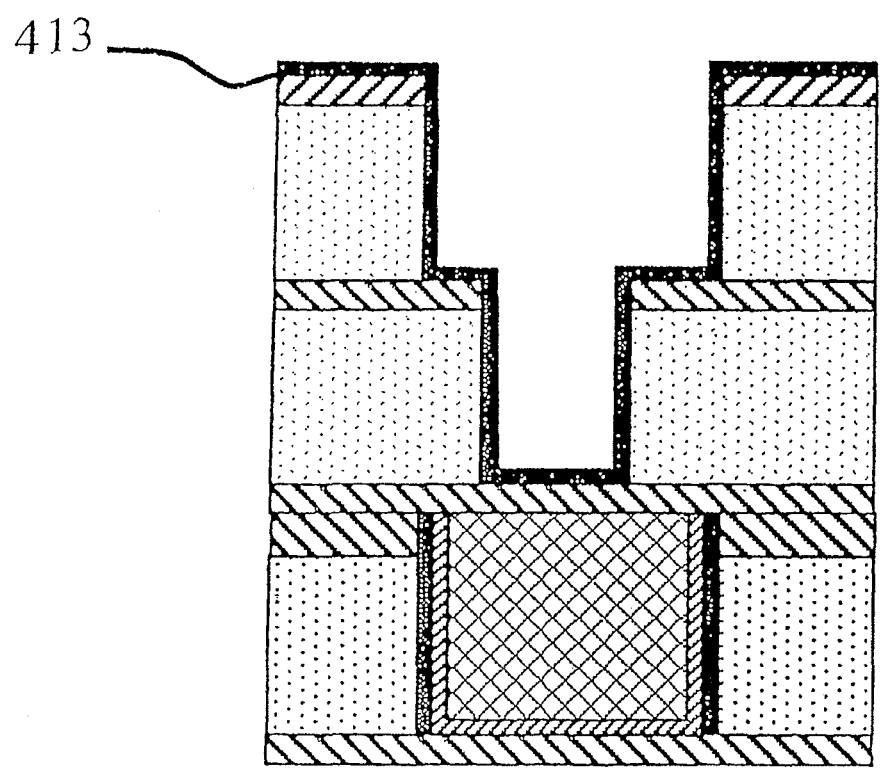

Then, as illustrated in FIG. 3C, an insulation barrier layer 413 made of organic substance is formed on whole surface, namely, the upper surface of the hard mask 411, the side surface of the wiring trench 412, and the upper surfaces of the cap film 407 and the etch stop film 409.

In the case, the insulation barrier layer 413 is such as the layer made of organic substance, layers made of silicon, carbon and organic substance, the layer made of organic substance including Si—O binding or organic substance including silicon in the range of 1 atm % to 10 atm %. It is preferable that those include carbon content much more than the content of the hard mask film, the etch stop film and the cap film, and to include silicon atoms in the range less than the hard mask film, the etch stop film and the cap film.

In the case, the insulation barrier layer 413 can be formed, for example, by the plasma polymerization method. For example, such as a BCB film and BCB compound can be utilized for the insulation barrier layer 413, which are formed using DVS-BCB as the raw material. The BCB compound means, for example, the compound formed by mixing BCB known in IEDM Processing, 2003, Kawahara et al, pp 143. and etc. with two kinds of raw material or more.

Further, it is better that the thickness of the stacked insulation barrier layer 413 is in the vicinity of 0.1 to 100 nm, preferably 1 to 20 nm which prevents to extremely narrow the trench width to a fine wiring trench.

Figure 3D:
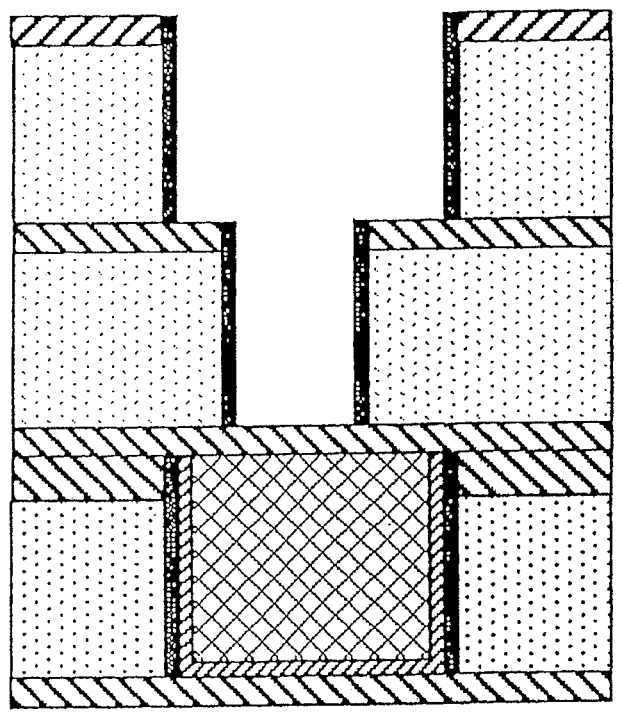

Then, the insulation barrier layer 413 is etched back, as illustrated in FIG. 3D. In the case, a preferable etching back for controlling process performance of the fine wiring is to selectively remove only the insulation barrier layer 413 laid on the wiring trench and the bottom of the via without exposing the upper surface of the porous insulation film 410.

The etching back process for the insulation barrier layer 413 will be described in detail from the view points of etching rate and anisotropy in etching, taking the reactive dry etching by mixed gas of CH2F2/N2/H2 system, as the example.

Figure 4A:
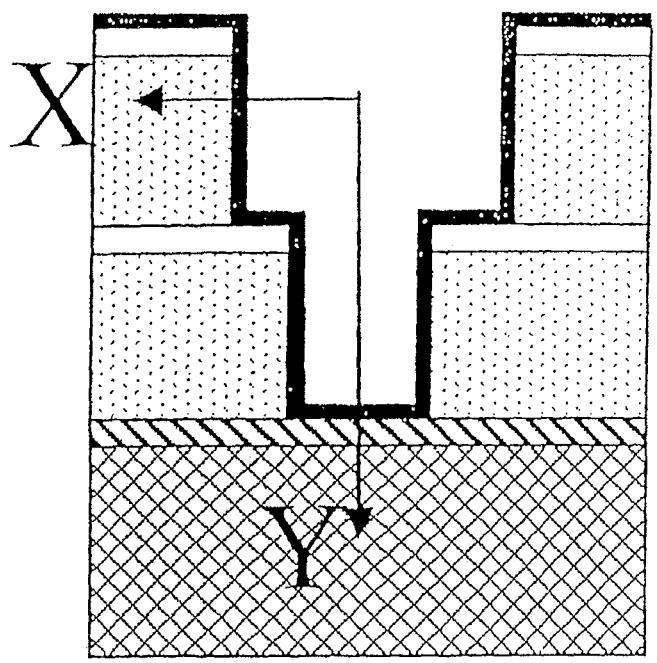
FIG. 4A is a partial and vertical cross sectional view showing etching of an insulation barrier layer of a semiconductor device in accordance with a first embodiment of the present invention.
Figure 4B:
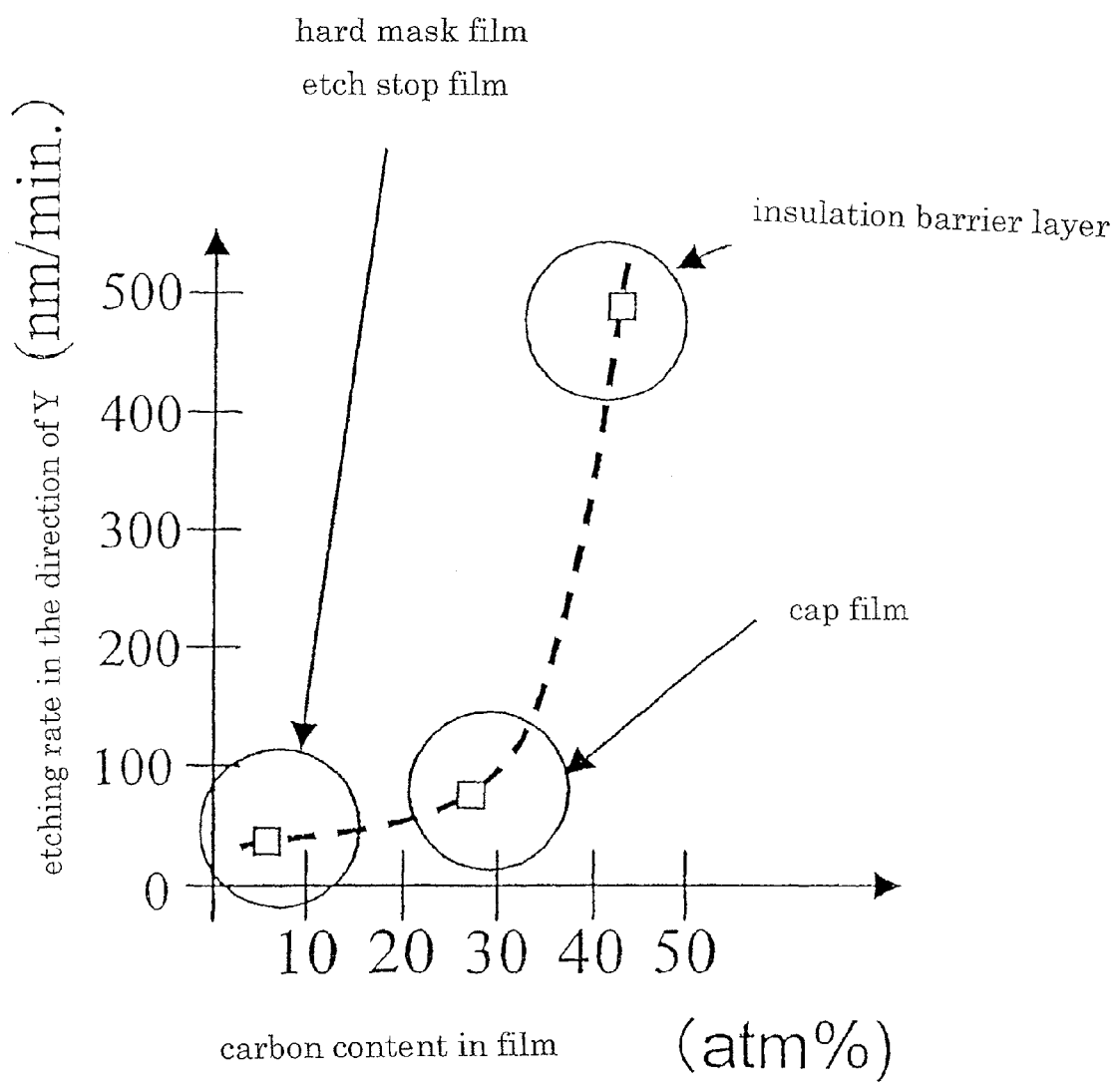
FIG. 4B is a graph showing relationships between carbon content inside a film and etching rate in the direction of Y regarding etching process of the insulation barrier layer illustrated in FIG. 4A.

FIG. 4A shows the etching direction of the insulation barrier layer 413, in which the Y direction defines the etching rate in the bottom portion of the wiring trench, and the X direction defines the etching rate in the side surface. FIG. 4B shows dependency of the etching rate in the direction of Y to carbon content in the insulation barrier layer. For example, in case of carbon content of the hard mask film 411 and the etch stop film 409 with 10 atm % or less and carbon content of the insulation barrier layer 413 with 40 atm % or less, the hard mask film 411 and the etch stop film 409 could remain without removing. Accordingly, the etching can be processed without exposing the upper surface of the porous insulation film 410.

Figure 3E:
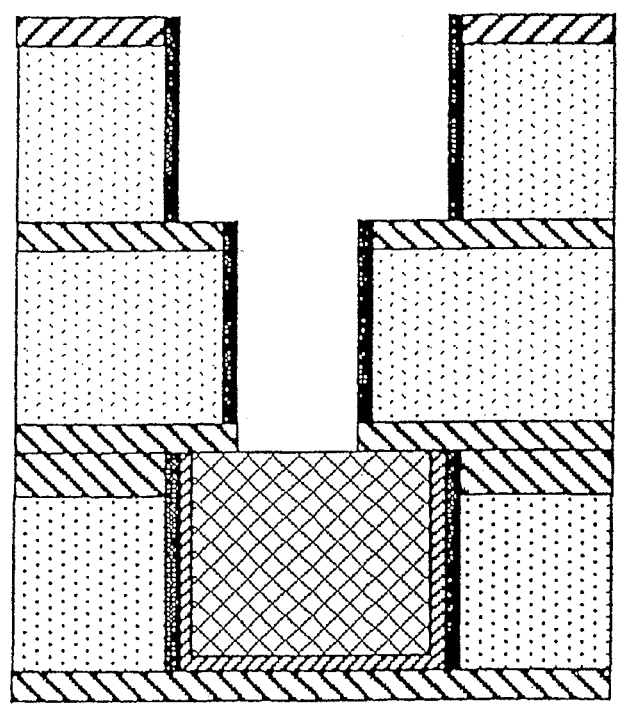
Figure 4C:
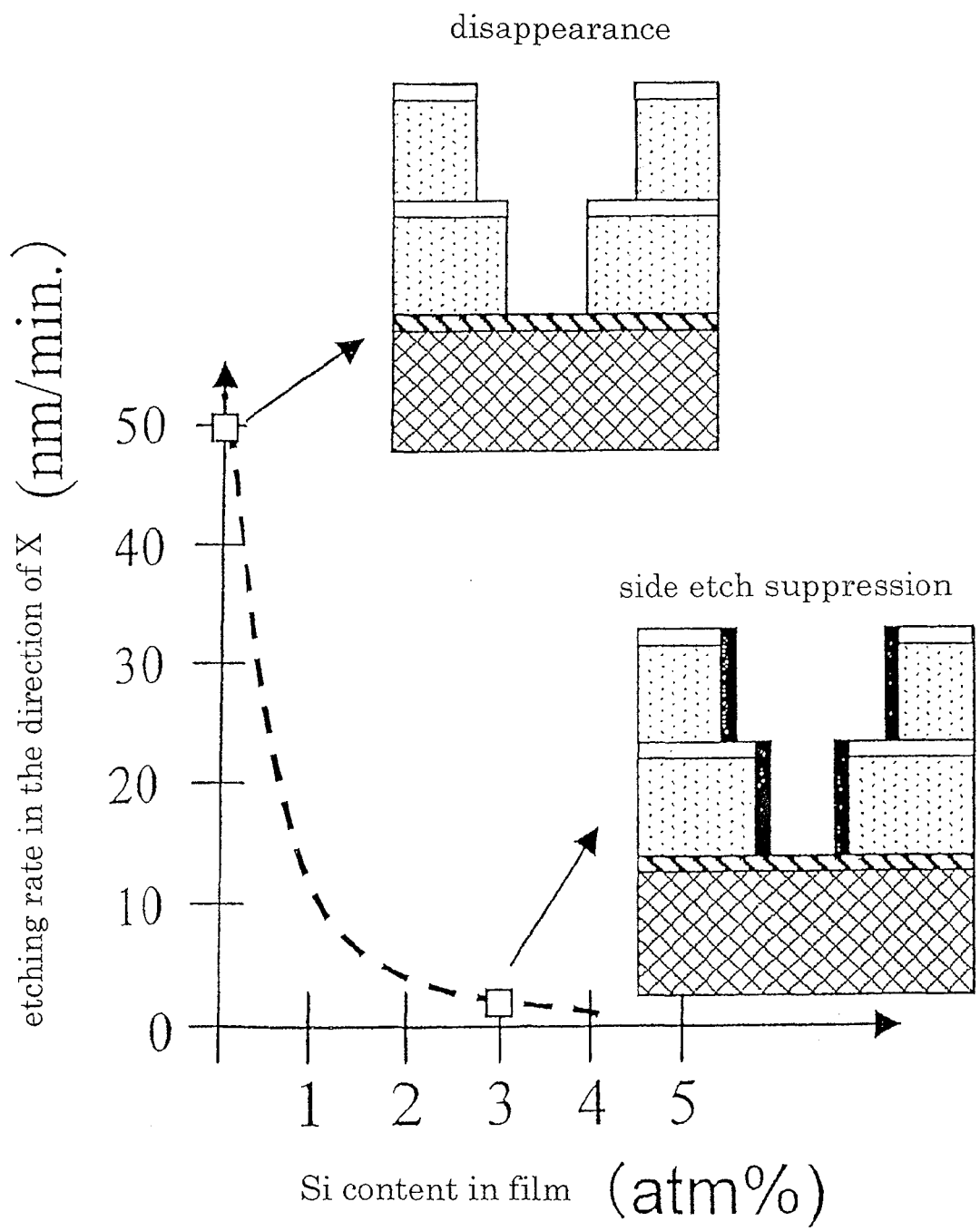
FIG. 4C is a graph showing relationships between silicon content inside a film and etching rate in the direction of X regarding etching process of the insulation barrier layer illustrated in FIG. 4A.

Further, through including silicon in the insulation barrier layer 413 with organic substance, wiring processing can be more precisely controlled because of suppressing the side etching. FIG. 4C shows dependency of etching rate in the direction of X to silicon content. However, with regards to etching for removing the insulation barrier layer 413 formed in the bottom of the wiring trench, the insulation barrier layer 413 formed in the side surface and in which the organic substance does not include silicon at all, tends to unintentionally disappear by side etching because etching rate in the direction of X is large. In the case, it is possible to reduce the etching rate in the direction of X, and to suppress the side etching by allowing silicon at 3% to include in the insulation barrier layer 413, for example. On the contrary, in case that processing performance is controlled taking into consideration of both of the etching selection rate and the anisotropy in etching, it is required that the insulation barrier layer 413 includes silicon atoms in the range less than the hard mask film 411, the etch stop film 409 and the cap film 407, because the etching rate in the direction of Y reduces when silicon is included in surplus Then, as illustrated in FIG. 3E, the cap film 407 at the via bottom is etched. In the case, a preferable etching of the cap film 407 for controlling process performance of the fine wiring is to selectively remove only the cap film 407 at the via bottom without removing the insulation barrier layer 413 at the side surface.

Figure 4D:
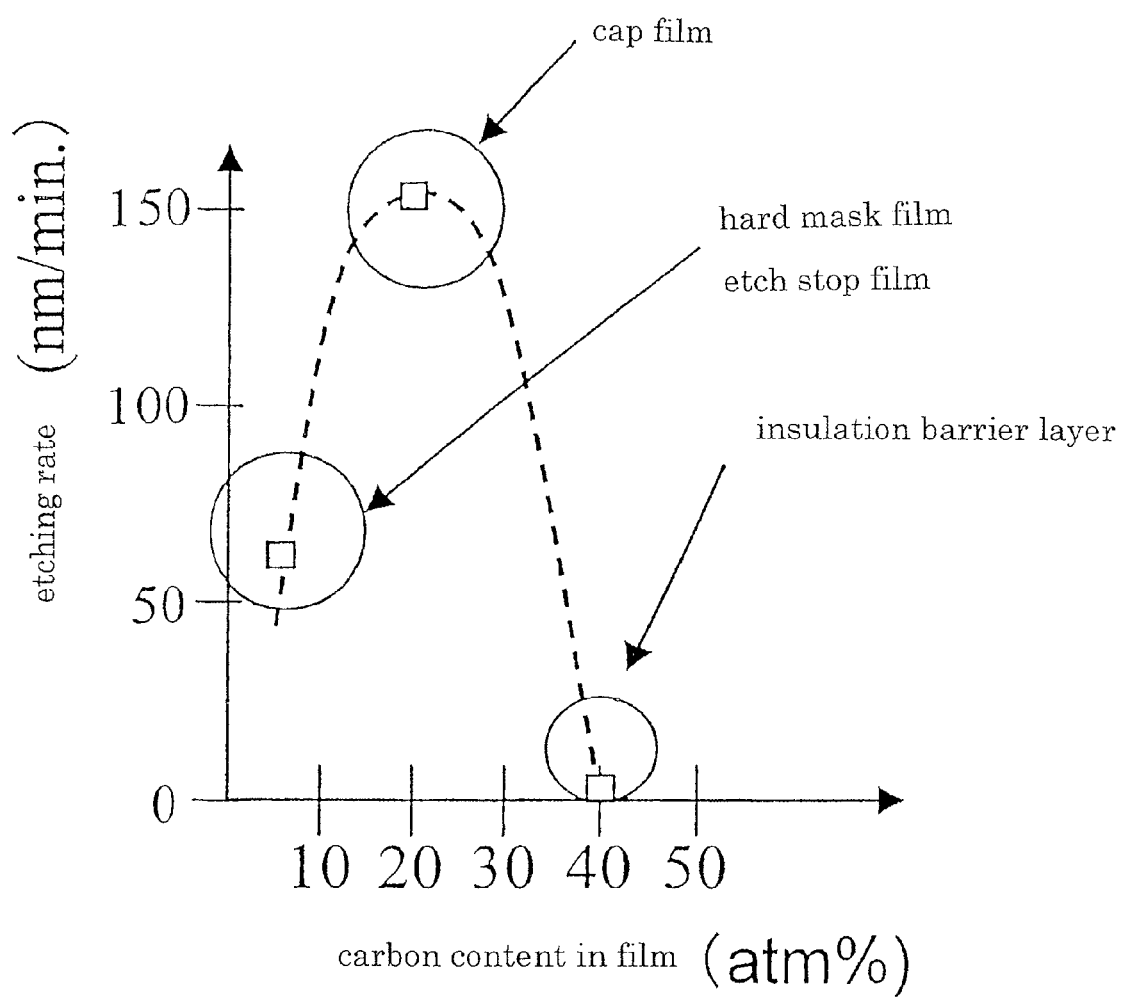
FIG. 4D is a graph showing relationships between carbon content inside a film and etching rate regarding etching process of a cap film illustrated in FIG. 4A.

Here, reactive dry etching by mixed gas of CF4/Ar/O2 system will be described in detail as the example. FIG. 4D shows dependency of etching rate to carbon content in the film. For example, in case of carbon content of the hard mask film 411 and the etch stop film 409 with 5 atm %, carbon content of the cap film 407 with 20 atm % and carbon content of the insulation barrier layer 413 with 40 atm %, the insulation barrier layer 413 formed in the side wall of the wiring trench could remain without removing because the etching rate of the cap film 407 easily becomes ten times or more to the rate of the insulation barrier layer 413.

In the case that the cap film, the etch stop film and the hard mask film are the same material, the processing configuration can be controlled with the conditions that the etch stop film and the hard mask film are larger than the cap film in thickness, or have a structure laminated thereon by material lower than the cap film in carbon content.

Thus, it is possible to form the insulation barrier layer 413 to the side surface of the wiring trench by controlling etching rate based on carbon quantity included in the insulation barrier layer.

From the above mentioned, the optimal insulation barrier layer for forming a insulation barrier layer in the side surface of a porous insulation film is the insulation barrier layer including carbon content much more than the hard mask film, the etch stop film and the cap film, and is the insulation barrier layer including silicon atoms in the range less than the hard mask film, the etch stop film and the cap film.

In the case, the insulation barrier layer 413 may be formed in any other portions in which a connecting portion is opened to the under layer as long as the performance of the semiconductor is not influenced badly.

Figure 3F:
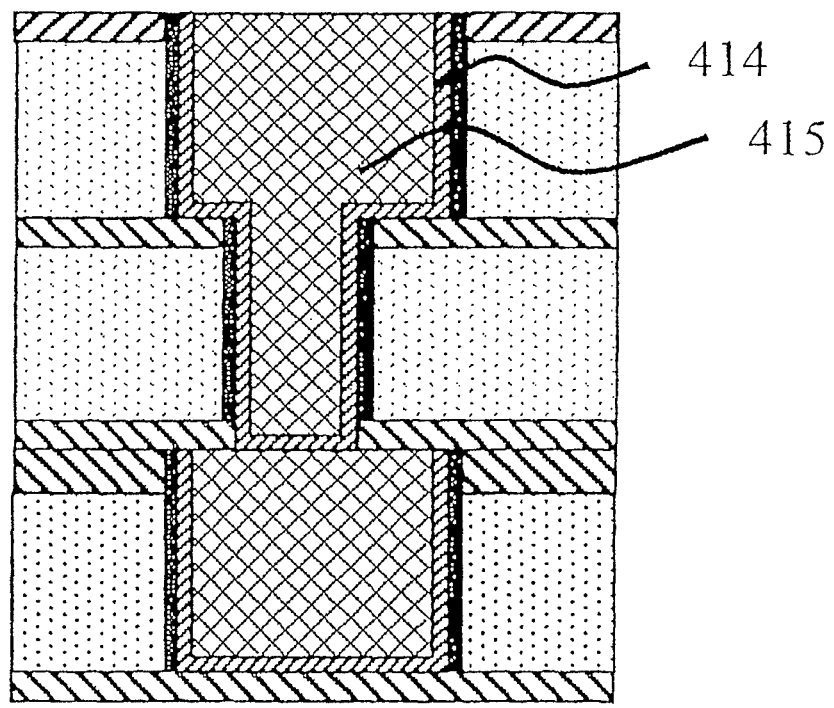

Then, as illustrated in FIG. 3F, the second Cu film is embedded in the formed wiring trench so that the Cu wiring 415 overlaid by the barrier metal 414 is formed. In the case, the barrier metal film 414 is preferably made of metal such as Ti, W or Ta, or nitride metal, or lamination of metal and nitride metal. For example, a film laminated by Ta/Ta N is better. For forming the barrier metal 414, any one of the CVD method, the PVD method and the ALCVD method can be used because the side surface is overlaid by the insulation barrier layer 413. In addition, because the insulation barrier layer 413 is inserted between the porous insulation film 410 and the barrier metal film 414, adhesiveness of those films is high enough to prevent the film from peeling in the CMP.

In the case, for embedding Cu there are used such as the PVD method, the Ionized-PVD method, the CVD method, the plasma CVD method, the electrolyte plating method and non-electrolyte plating method. Any one of them can be used, or any combination of them can be utilized. Forming method for Cu does not limit the present invention.

Also, the Cu wiring 415 is made of metal including Cu as a main component, and it may include, according to need, dissimilar metal such as Ti, Sn, Zn, AL or it may be inserted by Ta, Ti, W, Si and nitrogen compound of them or laminated film of them (not shown).

For example, in order to include dissimilar metal into the Cu wiring, there is provided a process in which a Cu layer with about 30 to 100 nm in thickness is formed as the seed layer, into which dissimilar metal is included in advance in the range of 0.1 to 5.0 atm % by the PVD method, thereafter embedding Cu using electrolyte plating method, and then including Cu into the wiring by heat diffusion.

The credibility to insulation between wirings was evaluated with regards to the Cu wiring thus manufactured. There was applied an electric field stress of 2.5 MV/cm at the temperature of 125 to the comb like evaluation sample having the wiring distance of 100 nm, the facing length of 1 cm and the via hole diameter of 100 nm, so that stress time dependency of dielectric breakdown was measured. For the use of comparison two samples were made. The one is formed with a BCB film as the insulation barrier layer on the side surface and the other is not formed with the BCB film as the insulation barrier layer on the side surface. The MTF (Median Time To Failure) of insulation life was improved about 5 times and the incipient failure greatly reduced by forming the BCB film in the side surface.

According to yield evaluation of the via in the Cu wiring thus manufactured, deterioration of the via yield is discernible with regards to the sample which is not formed with a BCB film on the side surface, and deterioration of the via yield is not discernible with regards to the sample which is formed with a BCB film in the side surface.

Thus, without deteriorating wiring performance, improvement on the insulation credibility between wirings can be achieved, thereby enabling to manufacture a semiconductor product with high yield.

Hereinbefore, one example of the BCB film by the CVD method is illustrated.

Also, a single layer of Ta or a single layer of TaN can be utilized as barrier metal, instead of PVD-Ta/TaN.

The wiring structure can be easily confirmed by the product. Organic substance including C as the main component is formed on the side surface of the porous insulation film made of the insulation film including Si, O and C. Metal of Ta system is formed so as to contact with the organic substance, inside which the wiring structure can be confirmed as a structure including C as the main component. Concretely, the wiring interlayer film can be confirmed by contrast. In addition to TEM, Si, O and C can be confirmed by elemental analysis such as EELS (Electron Energy-Loss Spectroscope) and EDX (Energy-Dispersive X-ray Spectroscopy). Also, it is possible to specify the organic substance of the side surface through confirming C and H by the elemental analysis. Also, with regards to the barrier metal of Ta system which contacts on the side film, the element Ta (and nitrogen) can be detected by elemental analysis. Further, Cu can be detected, because metal including Cu as a main component lies inside. Further, in case that the organic substance is a BCB film, it is possible to specify elements Si and O in addition to C in the BCB film, because only the BCB film exists and is substantially limited to itself, in the known film with the low dielectric constant, and made of organic substance having C as the main component and including Si and O which enables integration of Cu wiring.

(Second Embodiment)

Then, a wiring structure on the second embodiment of the present invention will be described.

Figure 5A:
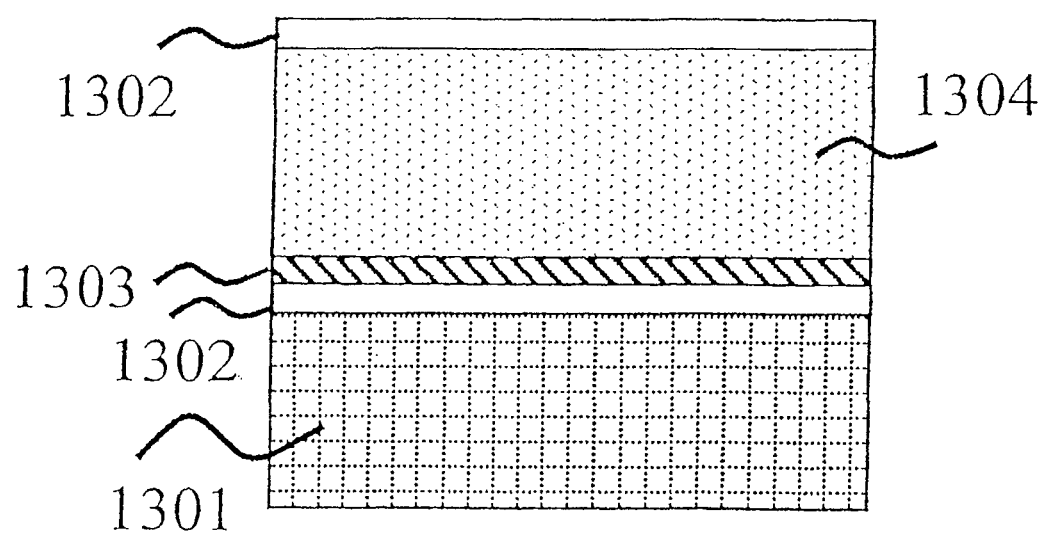
FIGS. 5A to 5I are partial and vertical cross sectional views showing a series of processes in a method for manufacturing a semiconductor device in accordance with a second embodiment of the present invention.

In the wiring structure of the second embodiment of the present invention, as illustrated in FIG. 5A, there are laminated on a substrate (not shown) forming a semiconductor device, a via interlayer insulation film 1301 made of a third insulation film, a hard mask film 1302 made of a second insulation film, a cap film 1303 made of a first insulation film, a porous insulation film 1304 and a hard mask film 1302 made of a second insulation film, respectively.

In the description below, the first insulation film, the second insulation film and the third insulation film are inscribed on the surface such as a cap film, a hard mask film and a via interlayer insulation film respectively, in accordance with each role.

The hard mask film 1302 is, for example, made of a $SiO_2$ film, a SiC film, a SiCN film, a SiOCH film and so on.

The cap film 1303 is made of at least one or more layers of silicon carbide, compound of them, organic compound including carbon or hydrogen in the compound of them, or compound laminating them, and in some cases it may include oxygen. The film 1303 is, for example, made of SiC, SiCN, SiNH, SiCNH and so on.

It is preferable that the porous insulation film 1304 is at least one or more porous films including an air hole with a low dielectric constant, for example, the relative dielectric constant being 2.0 to 3.0. The typical examples of such films are a HSQ (hydrogen Silsesquioxane) film, a MSQ (Methyl Silsesquioxane) film (for example, JSR-LKD™, ALKAP™, IPS™, HOSP™), an organic polymer film (SiLK™, Flare™), or SiOH, SiOC (for example, Black Diamond™, CORAL™, AuroraULK™, Orion™ and so on), or an insulation film including organic substance in them, or a film with the porosity rate increased by adjusting the forming condition, for example, the substrate temperature or composition of the raw material in case that the porosity rates of those films are less than the desired values. According to need, in the porous insulation film 1304, there may be laminated or inserted, or may have a compositional distribution in the direction of the film thickness on the upper or lower surfaces, such as a thin silicon oxide film, a silicon nitride film, a silicon carbide film or a silicon carbonitride film.

It is preferable that the via interlayer insulation film 1301 is at least one or more films with a low dielectric constant, for example, the relative dielectric constant being 2.0 to 3.0. However, the via interlayer insulation film 1301 is not necessary to be porous in case that enough low capacitance between wirings can be obtained by the porous insulation film 1304. The typical examples of the via interlayer insulation film 1301 are a HSQ (hydrogen Silsesquioxane) film, a MSQ (Methyl Sisesquioxane) film (for example, JSR-LKD™, ALKAP™, IPS™, HOSP™), an organic polymer film (SiLK™, Flare™), or SiOH, SiOC (for example, Black Diamond™, CORAL™, AuroraULK™, Orion™ and so on), or an insulation film including organic substance in them, or a film with the porosity rate adjusted by adjusting the forming condition, for example, the substrate temperature or composition of the raw material in case that the porosity rates of those films are not the desired values.

Figure 5B:
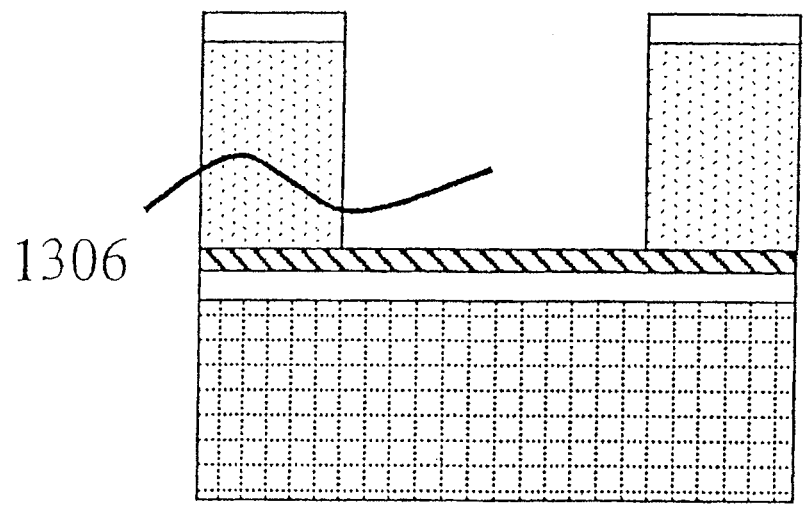

Then, as illustrated in FIG. 5B, a damascene wiring trench 1306 is formed in the interlayer insulation film using photo resist and reactive ion etching.

Figure 5C:
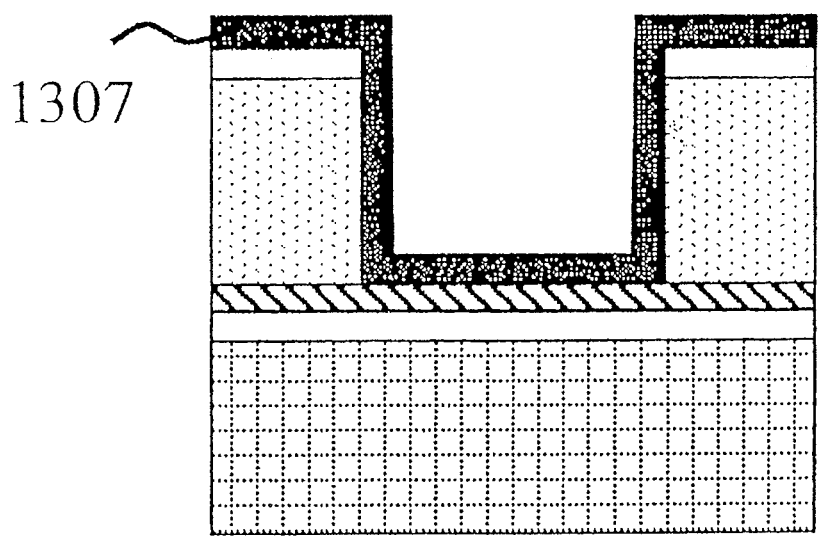

Then, as illustrated in FIG. 5C, an insulation barrier layer 1307 is formed on whole surface, namely, the upper surface of the hard mask 1302, the side surface of the wiring trench 1306 and the upper surface of the cap film 1303.

In the case, the insulation barrier layer 1307 is such as the layer made of organic substance, layers made of silicon, carbon and organic substance, the layer made of organic substance including Si—O binding or organic substance including silicon in the range of 1 atm % to 10 atm %. It is preferable that those include carbon content much more than the content of the hard mask film 1302 and the cap film 1303, and include silicon atoms in the range less than the hard mask film 1302 and the cap film 1303.

The BCB is, for example, a BCB film formed by the plasma polymerization method using DVS-BCB as the raw material. The BCB compound is, for example, a BCB compound formed by mixing BCB known in IEDM Processing, 2003, Kawahara et al, pp 143. and etc. with two kinds of raw material or more.

It is better that the thickness of the stacked insulation barrier layer 1307 is in the vicinity of 0.1 to 100 nm, preferably 1 to 20 nm which prevents to extremely narrow the trench width to a fine wiring trench.

Figure 5D:
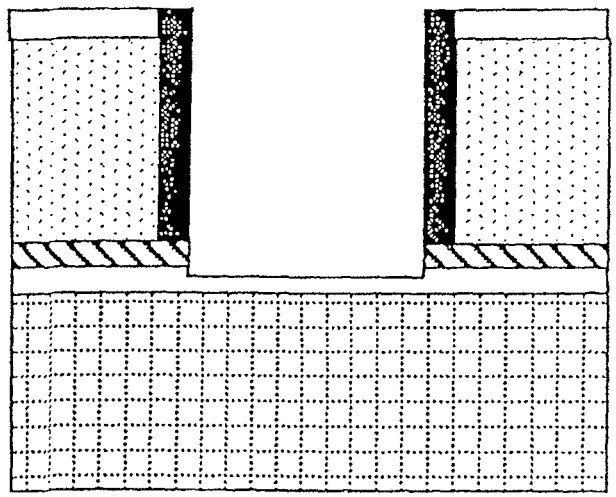

Then, the insulation barrier layer 1307 is etched back, as illustrated in FIG. 5D. In the case, preferable etching and etching back for controlling process performance of the fine wiring are to selectively remove only the insulation barrier layer 1307 laid on the bottom of the wiring trench without exposing the upper surface of the porous insulation film 1304.

The etching back process for the insulation barrier layer 1307 will be described in detail from the view points of etching rate and anisotropy in etching, taking the reactive dry etching by mixed gas of CH2F2/N2/H2 system, as the example.

Figure 6A:
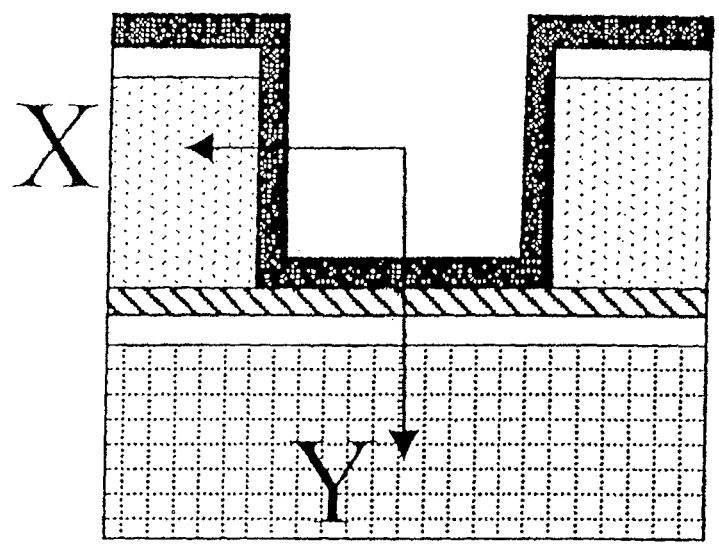
FIG. 6A is a partial and vertical cross sectional view showing etching of an insulation barrier layer of a semiconductor device in accordance with a second embodiment of the present invention.
Figure 6B:
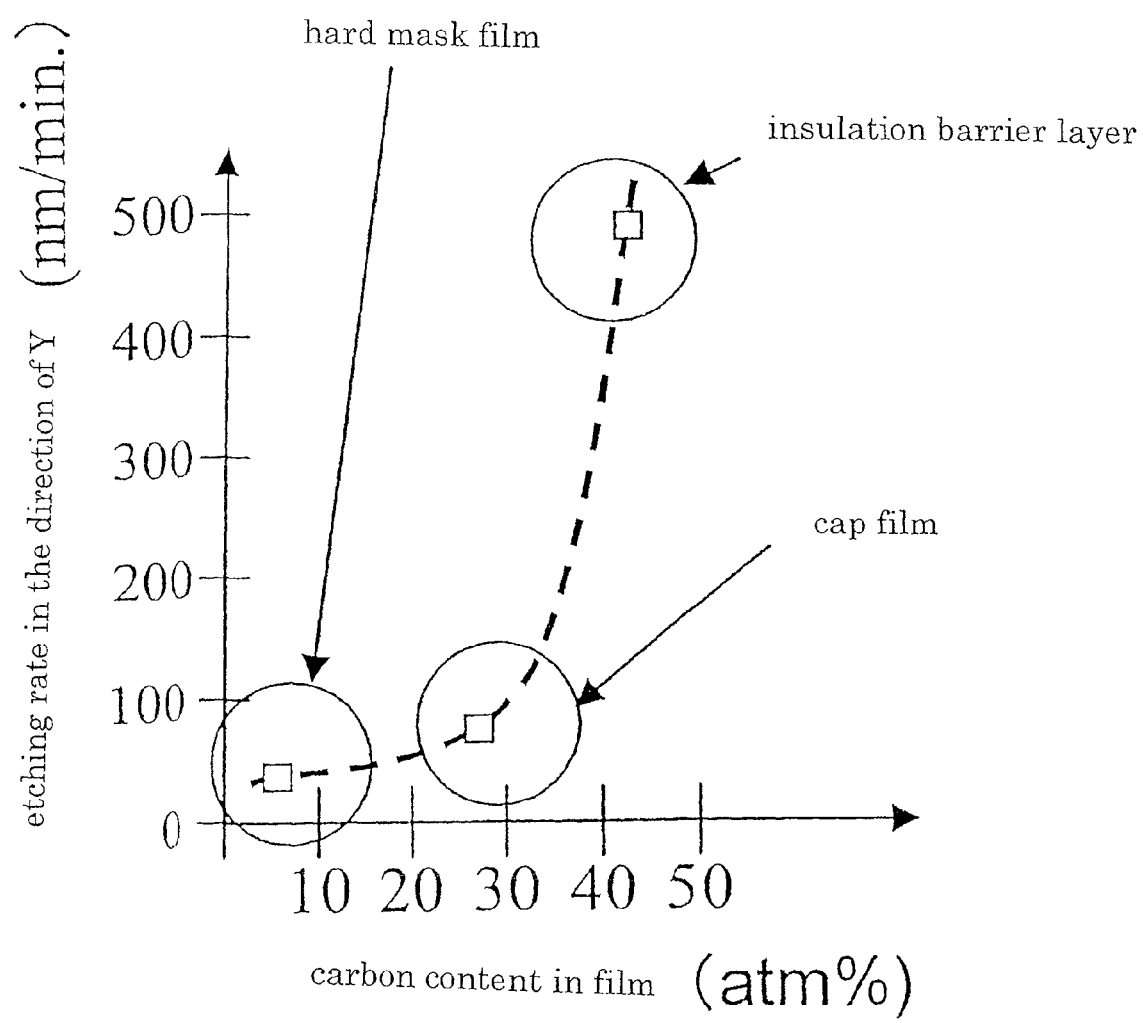
FIG. 6B is a graph showing relationships between carbon content inside a film and etching rate in the direction of Y regarding etching process of the insulation barrier layer illustrated in FIG. 6A.

FIG. 6A shows the etching direction of the insulation barrier layer 1307, in which the Y direction defines the etching rate in the bottom portion of the wiring trench, and the X direction defines the etching rate in the side surface. FIG. 6B shows dependency of the etching rate in the direction of Y to carbon content in the layer. For example, in case of carbon content of the hard mask film 1302 with 10 atm % or less and carbon content of the insulation barrier layer 1307 with 40 atm % or less, the hard mask film 1302 could remain without removing because the etching rate of the insulation barrier layer 1307 easily becomes ten times or more to the rate of the hard mask film 1302. Accordingly, the etching can be processed without exposing the upper surface of the porous insulation film 1304.

Figure 6C:
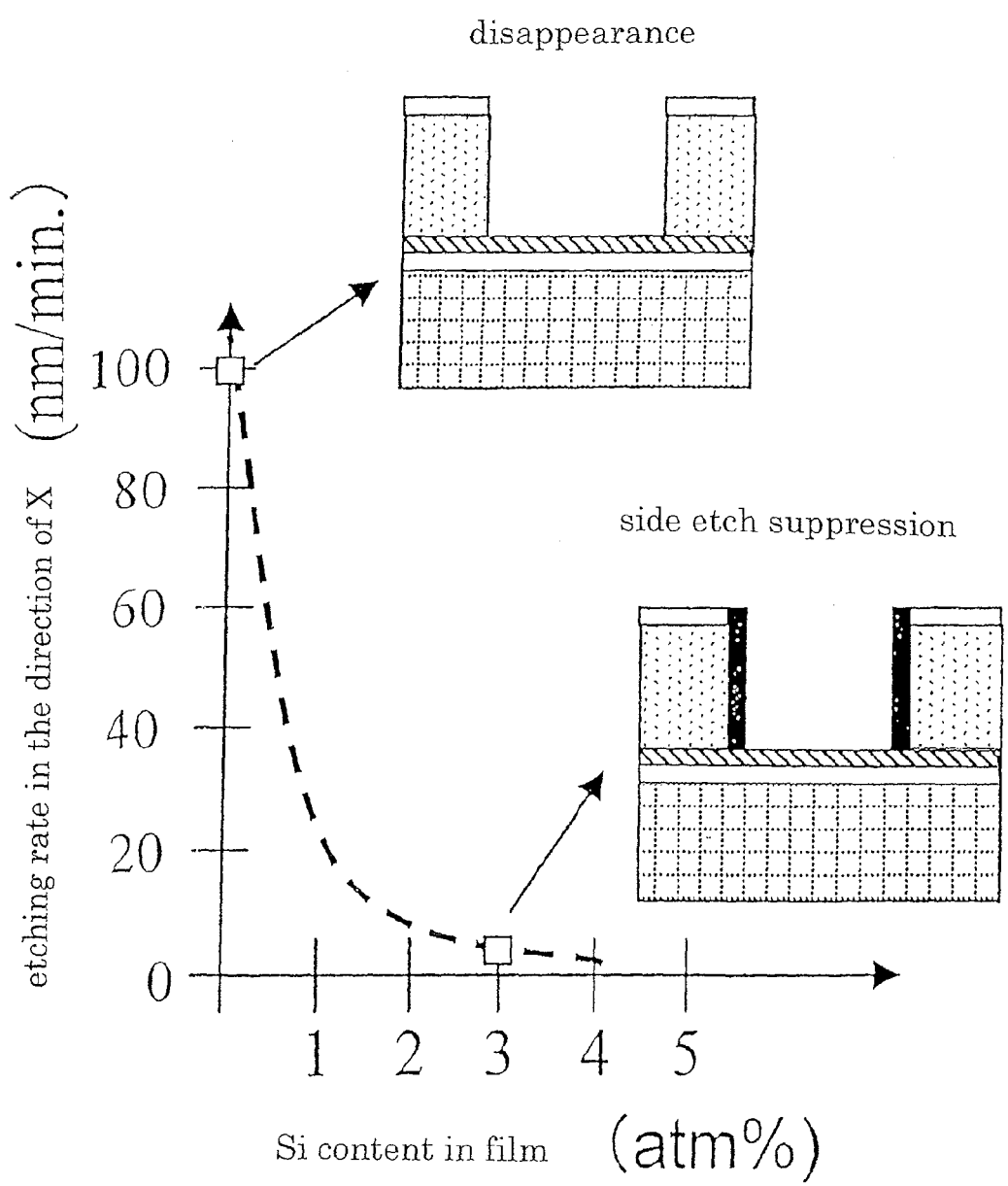
FIG. 6C is a graph showing relationships between silicon content inside a film and etching rate in the direction of X regarding etching process of the insulation barrier layer illustrated in FIG. 6A.

Further, through including silicon in the insulation barrier layer 1307 with organic substance, wiring processing can be more precisely controlled. FIG. 6C shows dependency of etching rate in the direction of X to silicon content. However, with regards to etching for removing the insulation barrier layer 1307 formed in the bottom of the wiring trench, the insulation barrier layer 1307 formed in the side surface and in which the organic substance does not include silicon at all, tends to unintentionally disappear by side etching because etching rate in the direction of X is large. In the case, it is possible to reduce the etching rate in the direction of X, and to suppress the side etching by allowing silicon at 3% to include in the insulation barrier layer 1307. To control processing performance taking into consideration of both of the etching selection rate and the anisotropy in etching, it is required that the insulation barrier layer 1307 includes silicon atoms in the range less than the hard mask film 1302 and the cap film 1303.

Consecutively, the cap film 1303 in the bottom of the wiring trench is etched. In the case, the insulation barrier layer 1307 formed in the side surface remains without removing. In the case, because the side surface of the porous insulation film 1304 is overlaid by the insulation barrier layer 1307, there is no occurrence of malfunction that Cu having flied in all directions in etching penetrates into the porous insulation film 1304.

In the case, a preferable etching of the cap film 1303 for controlling process performance of the fine wiring is to selectively remove only the cap film 1303 at the via bottom without removing the insulation barrier layer 1307 at the side surface.

Figure 6D:
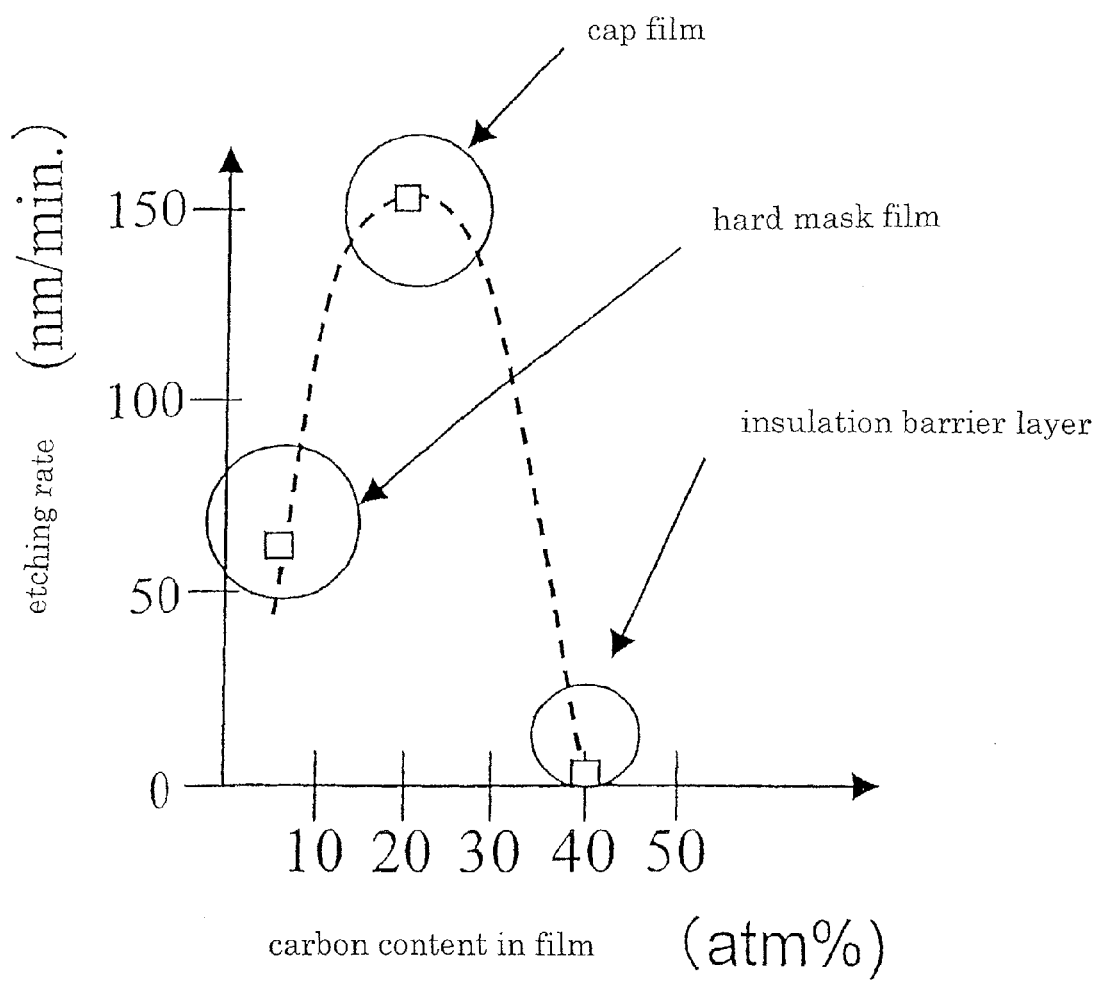
FIG. 6D is a graph showing relationships between carbon content inside a film and etching rate regarding etching process of a cap film illustrated in FIG. 6A.

Here, reactive dry etching by mixed gas of $CF4/Ar/O_2$ system will be described in detail as the example. FIG. 6D shows dependency of etching rate to carbon content in the film. For example, in case of carbon content of the hard mask film 1302 with 5 atm %, carbon content of the cap film 1303 with 20 atm % and carbon content of the insulation barrier layer 1307 with 40 atm %, the hard mask film 1302 and the insulation barrier layer 1307 formed in the side wall of the wiring trench could remain without removing because the etching rate of the cap film 1303 easily becomes ten times or more to the rate of the insulation barrier layer 1307.

In the case that the cap film 1303 and the hard mask film 1302 are wanted to be the same material, the processing configuration can be controlled with the conditions that the hard mask film 1302 is larger than the cap film 1303 in thickness, or has a structure laminated thereon by material lower than the cap film 1303 in carbon content.

Thus, it is possible to form the insulation barrier layer made of organic substance in the side surface of the wiring trench by controlling etching rate based on carbon quantity included in the insulation barrier layer 1307.

From the above mentioned, material of the optimal insulation barrier layer 1307 for forming the insulation barrier layer 1307 in the side surface of the porous insulation film is the material in which carbon content quantity included in the insulation barrier layer 1307 is much more than that of the hard mask film 1302 and the cap film 1303, respectively. Further, the insulation barrier layer 1307 includes silicon atoms in the range less than that of the hard mask film 1302 and the cap film 1303, respectively.

Figure 5E:
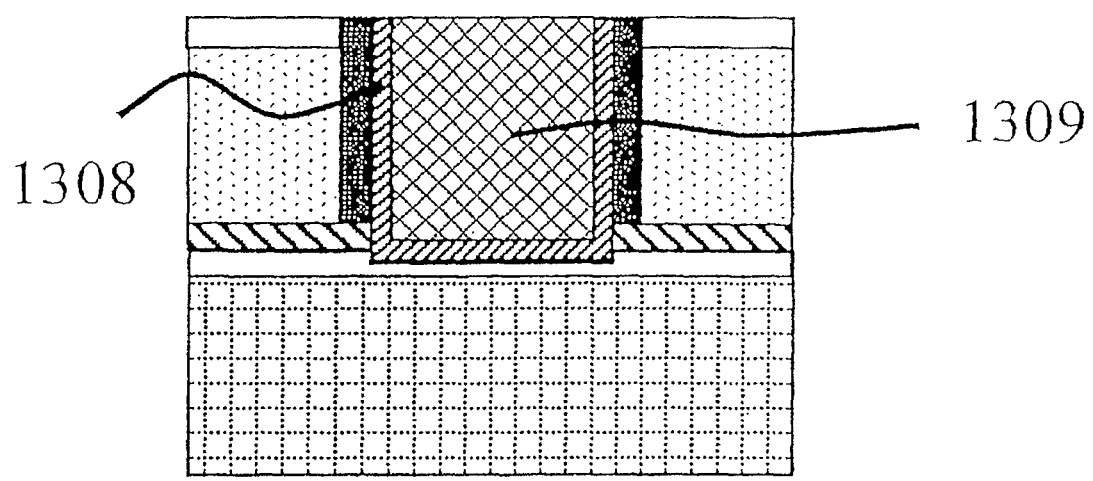

Then, as illustrated in FIG. 5E, after the Cu film is embedded in the formed wiring trench, the Cu wiring 1309 overlaid by the barrier metal film 1308 is formed by CMP. In the case, for embedding Cu there are used such as the PVD method, the Ionized-PVD method, the CVD method, the plasma CVD method, the electrolyte plating method and non-electrolyte plating method. Any one of them can be used, or any combination of them can be utilized. Forming method for Cu does not limit the present invention.

Also, the Cu wiring 1309 is made of metal including Cu as the main component, and it may include, according to need, dissimilar metal such as Ti, Sn, Zn or AL, or it may be inserted by Ta, Ti, W, Si and nitrogen compound of them or laminated films of them (not shown).

For example, in order to include dissimilar metal into the Cu wiring, there is provided a process in which a Cu layer with about 30 to 100 nm in thickness is formed as the seed layer, into which dissimilar metal is included in advance in the range of 0.1 to 5.0 atm % by the PVD method, thereafter embedding Cu using electrolyte plating method, and then including Cu into the wiring by heat diffusion.

The barrier metal 1308 is made of Ta, Ti, W, Si and nitrogen compound of them, or laminated film of them (not shown).

For forming the barrier metal film 1308, any one of the PVD method, the Ionized-PVD method, the CVD method, the plasma CVD method, the heat CVD method and the ALD (Atomic Layer Deposition) method can be used because the side surface of the wiring trench is overlaid by the insulation barrier layer 1308. Further, a plurality of the forming methods can be combined.

Figure 5F:
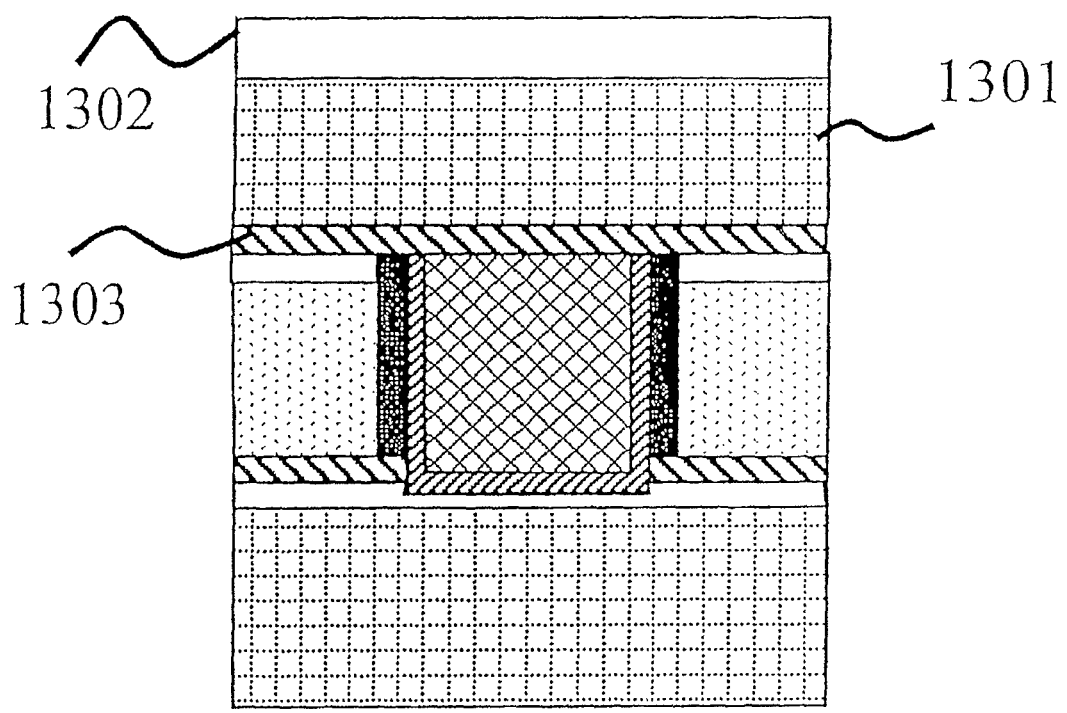

Then, as illustrated in FIG. 5F, the cap film 1303, the via interlayer insulation film 1301 and the hard mask film 1302 are formed on the formed Cu wiring.

Figure 5G:
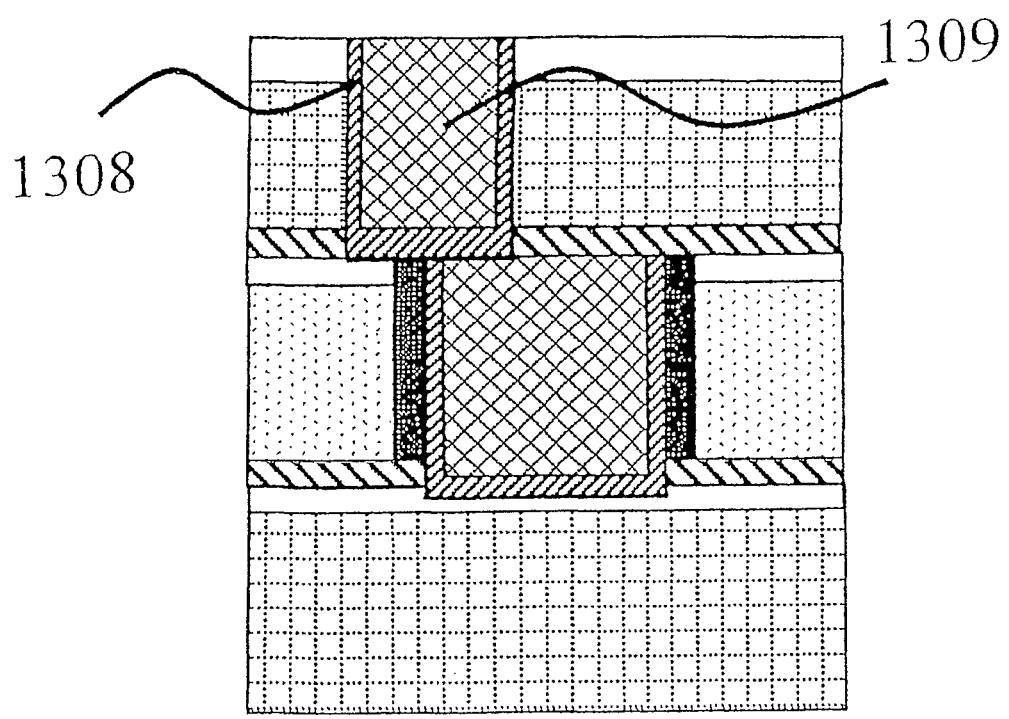

Then, as illustrated in FIG. 5G, the via hole is formed in the interlayer insulation film, in which the Cu connecting plug made of the barrier metal film 1308 and the Cu film 1309 is formed, using photo resist and reactive ion etching.

Figure 5H:
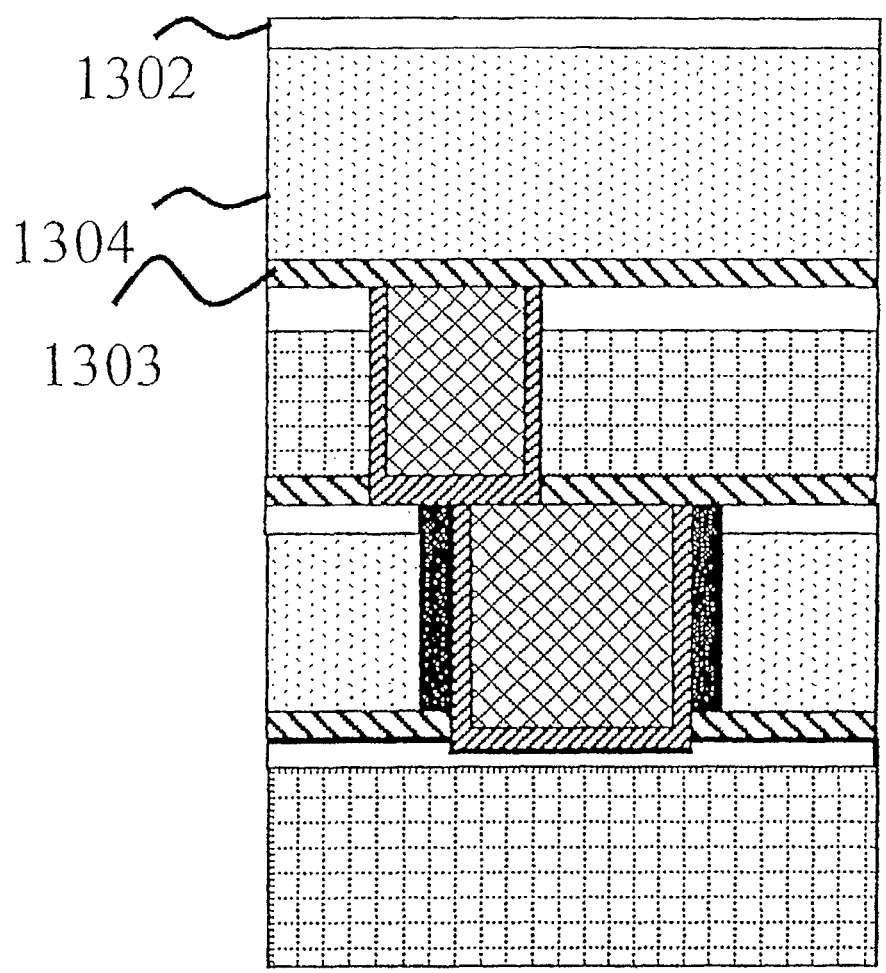

Then, as illustrated in FIG. 5H, the cap film 1303, the porous insulation film 1304 and the hard mask 1302 are formed on the Cu connecting plug by laminating.

Figure 5I:
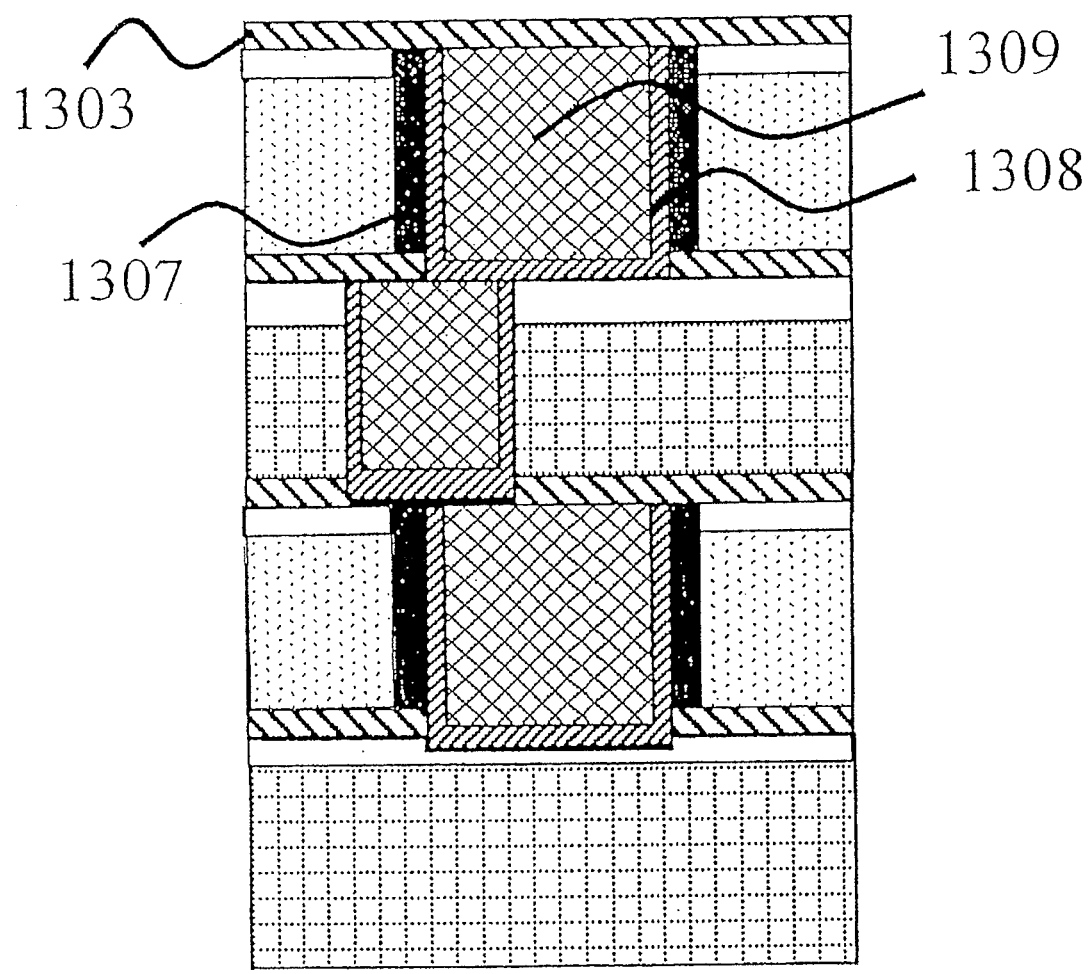

By repeating such a process for forming wiring, the multi-layered wiring is formed as illustrated in FIG. 5I. Thus, without deteriorating wiring performance, improvement on the insulation credibility between wirings can be achieved, thereby enabling to manufacture a semiconductor product with high yield. The credibility to insulation between wirings was evaluated with regards to the Cu wiring thus manufactured. There was applied an electric field stress of 3.0 MV/cm at the temperature of 125 to the comb like evaluation sample having the wiring distance of 100 nm, the facing length of 1 cm and the via hole diameter of 100 nm, so that stress time dependency of dielectric breakdown was measured. For the use of comparison, there is formed a sample which is not formed with the BCB film in the side surface. The MTF (Median Time To Failure) of insulation life was improved about 5 times and the incipient failure reduced by forming the BCB film in the side surface.

The wiring structure can be easily confirmed by the product through the same method as described in the first embodiment.

(Third Embodiment)

Then, a wiring structure on the third embodiment of the present invention will be described. This third embodiment is with regards to a modification of the wiring structure shown in FIG. 5I on the second embodiment mentioned above.

Figure 7A:
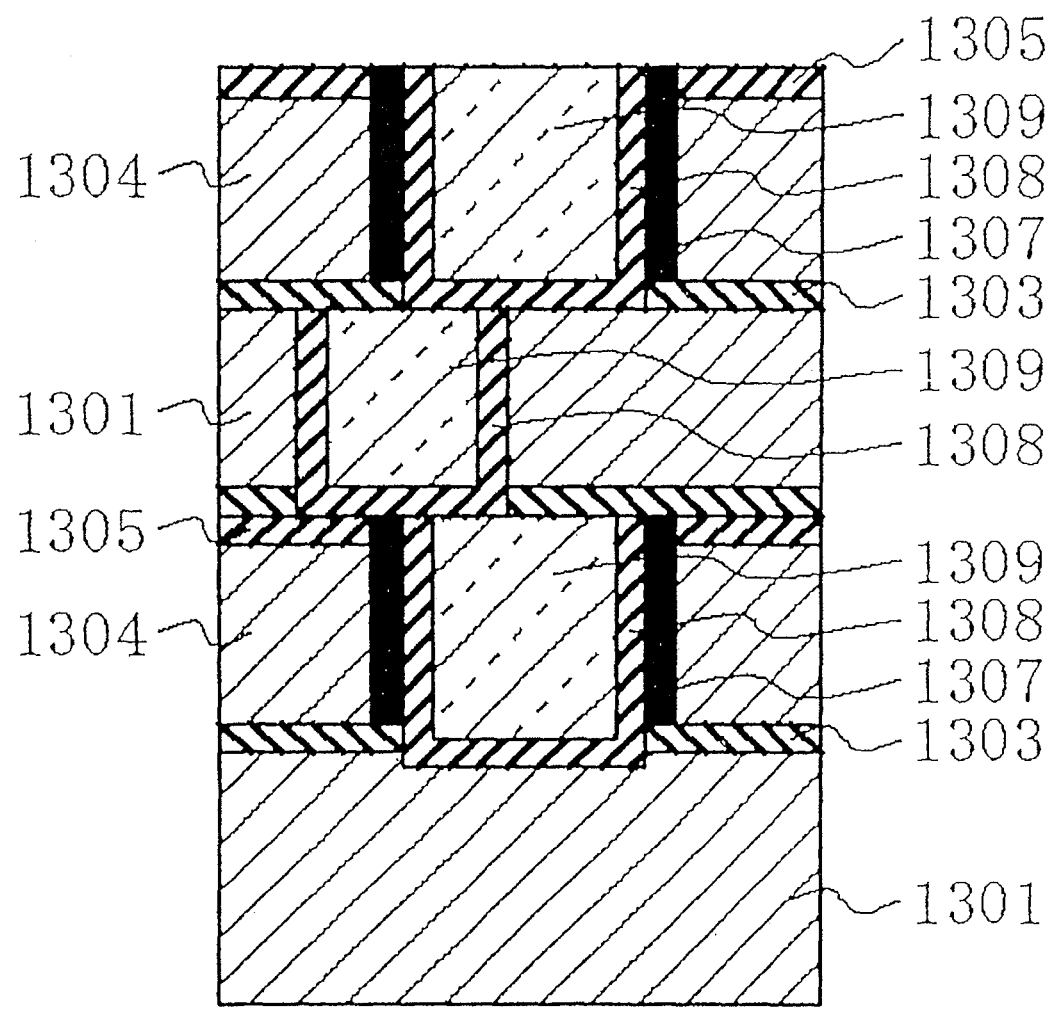
FIG. 7A is a partial and vertical cross sectional view showing a modification of the semiconductor device illustrated in FIG. 5I, in accordance with a third embodiment of the present invention.

The wiring structure illustrated in FIG. 7A is the modification of the wiring structure of the second embodiment illustrated in FIG. 5I. In accordance with the constitution illustrated in FIG. 5I, the wiring structure illustrated in FIG. 7A has the constitution in which the nonporous SiOCH film (Black Diamond™) corresponds to the via interlayer insulation film 1301, the SiCN film corresponds to the cap film 1303, the porous SiOCH film (Aurora ULK™) corresponds to the porous insulation film 1304, the SiO₂ film corresponds to the hard mask 1305, and the BCB film corresponds to the insulation barrier layer 1307, respectively. The others are so constituted to be identical to the wiring structure illustrated in FIG. 5I. The corresponding elements between FIG. 5I and FIG. 7A have the same reference code. The constitution is apparent from FIG. 7A, and the detailed explanation is omitted because of almost identical to that of the second embodiment.

Figure 7B:
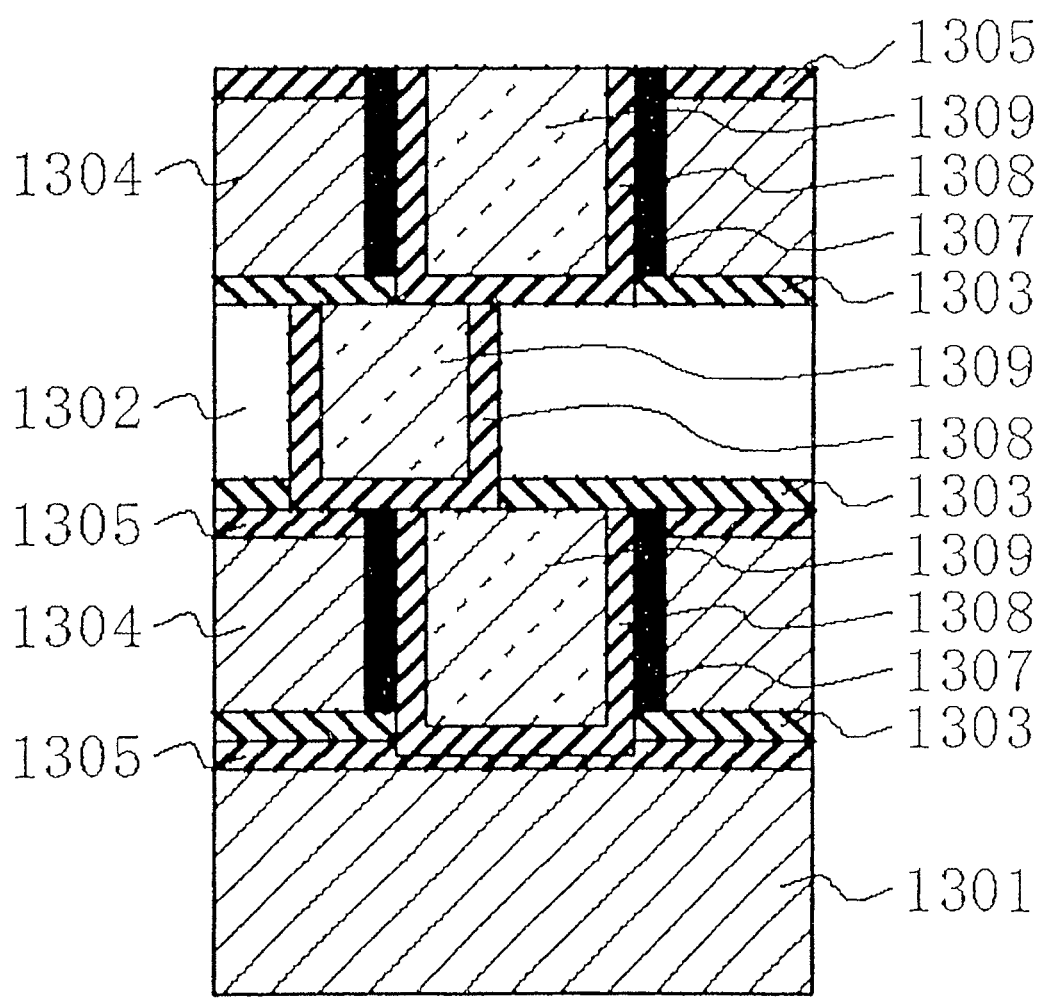
FIG. 7B is a partial and vertical cross sectional view showing a modification of the semiconductor device illustrated in FIG. 7A, in accordance with a third embodiment of the present invention.

The wiring structure illustrated in FIG. 7B is the modification of the wiring structure illustrated in FIG. 7A. In accordance with the constitution illustrated in FIG. 7A, the wiring structure illustrated in FIG. 7B has the constitution in which the silicon oxide film corresponds to the via interlayer insulation film 1301, the SiCN film corresponds to the cap film 1303, the porous SiOCH film (Aurora ULK™) corresponds to the porous insulation film 1304, the SiCN film corresponds to the hard mask 1305, and the BCB film corresponds to the insulation barrier layer 1307, respectively. The others are so constituted to be identical to the wiring structure illustrated in FIG. 7A. The corresponding elements between FIG. 7A and FIG. 7B have the same reference code. The constitution is apparent from FIG. 7B, and the detailed explanation is omitted.

Figure 7C:
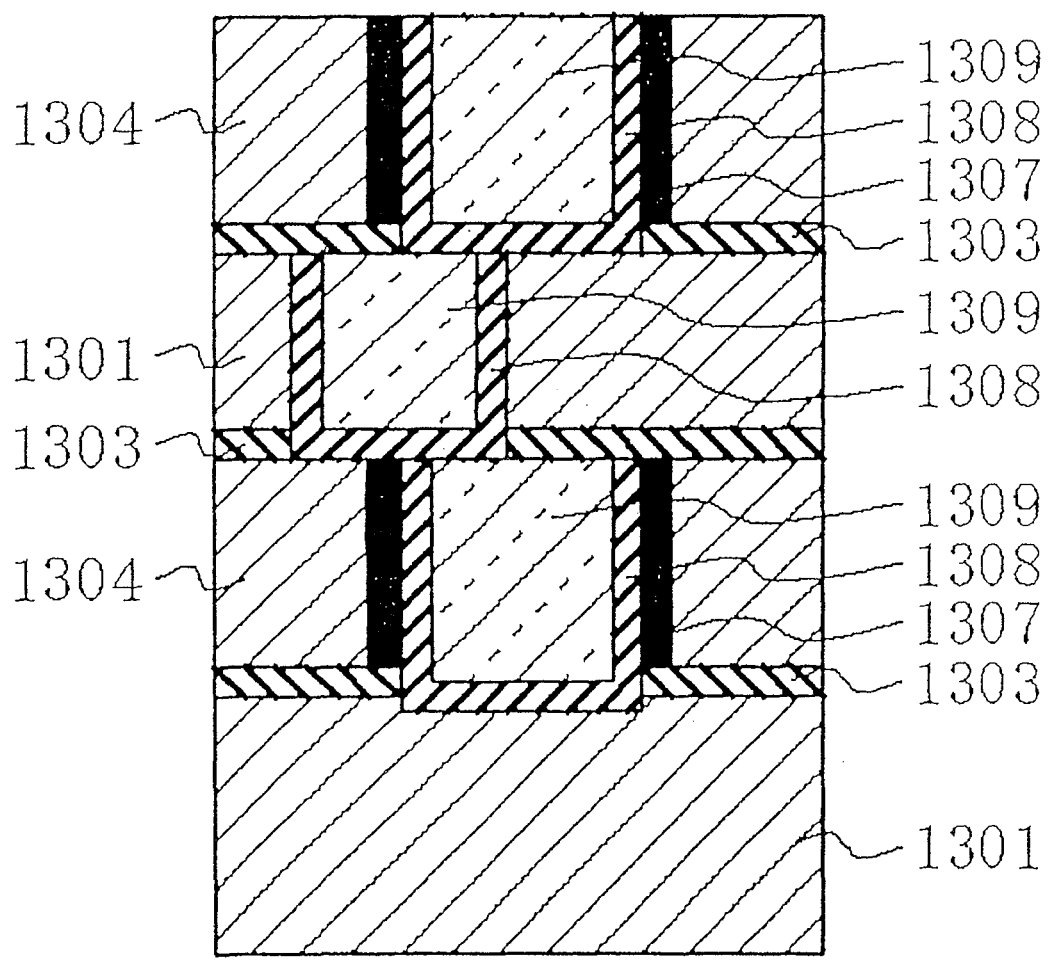
FIG. 7C is a partial and vertical cross sectional view showing a further modification of the semiconductor device illustrated in FIG. 7A, in accordance with a third embodiment of the present invention.

The wiring structure illustrated in FIG. 7C is the modification of the wiring structure illustrated in FIG. 7A. In accordance with the constitution illustrated in FIG. 7A, the wiring structure illustrated in FIG. 7C has the constitution in which the hard mask film 1305 is removed by polishing in processing of the Cu-CMP. The others are so constituted to be identical to the wiring structure illustrated in FIG. 7A. The corresponding elements between FIG. 7A and FIG. 7C have the same reference code. The constitution is apparent from FIG. 7C, and the detailed explanation is omitted.

Figure 7D:
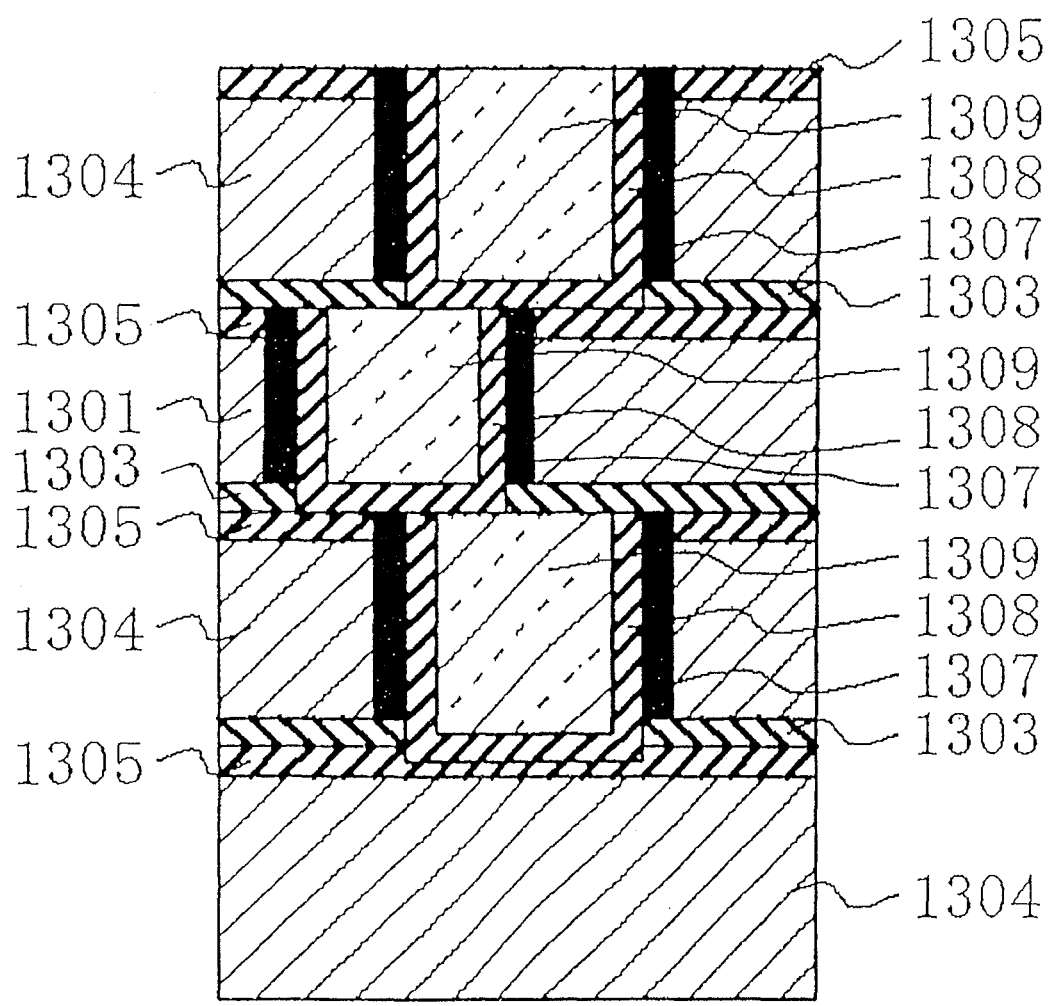
FIG. 7D is a partial and vertical cross sectional view showing a further modification of the semiconductor device illustrated in FIG. 5I, in accordance with a third embodiment of the present invention.

The wiring structure illustrated in FIG. 7D is the modification of the wiring structure illustrated in FIG. 5I. In accordance with the constitution illustrated in FIG. 5I, the wiring structure illustrated in FIG. 7D has the constitution in which the porous SiOCH film corresponds to the via interlayer insulation film 1301, the SiCN film corresponds to the cap film 1303, the porous SiOCH film (Aurora ULK™) corresponds to the porous insulation film 1304, the SiO₂ film corresponds to the hard mask film 1305 and the via portion corresponds to the insulation barrier layer 1307. The others are so constituted to be identical to the wiring structure illustrated in FIG. 5I. The corresponding elements between FIG. 7D and FIG. 5I have the same reference code. The constitution is apparent from FIG. 7D, and the detailed explanation is omitted.

Figure 7E:
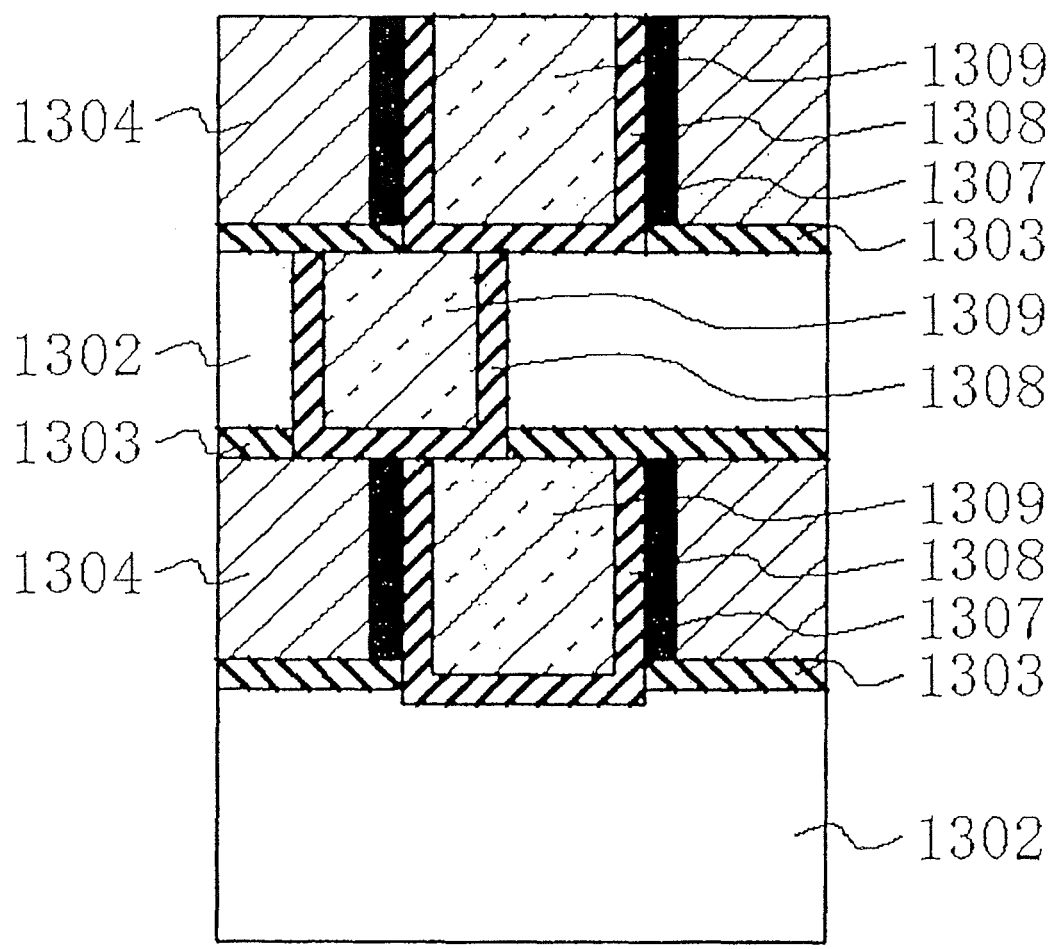
FIG. 7E is a partial and vertical cross sectional view showing a further modification of the semiconductor device illustrated in FIG. 7B, in accordance with a third embodiment of the present invention.

The wiring structure illustrated in FIG. 7E is the modification of the wiring structure illustrated in FIG. 7B. In accordance with the constitution illustrated in FIG. 7B, the wiring structure illustrated in FIG. 7E has the constitution in which the hard mask film 1305 is eliminated. The others are so constituted to be identical to the wiring structure illustrated in FIG. 7B. The corresponding elements between FIG. 7E and FIG. 7B have the same reference code. The constitution is apparent from FIG. 7E, and the detailed explanation is omitted.

Figure 7F:
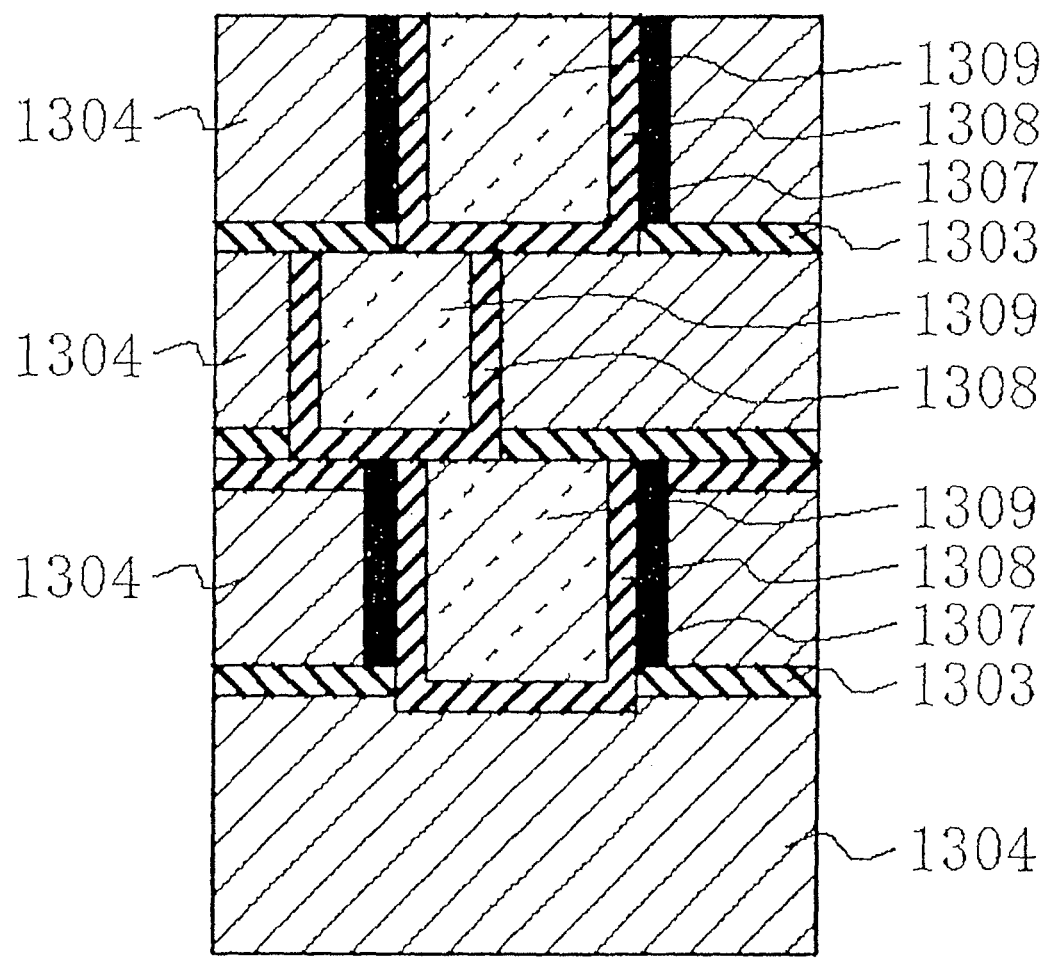
FIG. 7F is a partial and vertical cross sectional view showing a still further modification of the semiconductor device illustrated in FIG. 7B, in accordance with a third embodiment of the present invention.

The wiring structure illustrated in FIG. 7F is another modification of the wiring structure illustrated in FIG. 7B. In accordance with the constitution illustrated in FIG. 7B, the wiring structure illustrated in FIG. 7F has the constitution in which the hard mask film 1305 is eliminated. The others are so constituted to be identical to the wiring structure illustrated in FIG. 7B. The corresponding elements between FIG. 7F and FIG. 7B have the same reference code. The constitution is apparent from FIG. 7F, and the detailed explanation is omitted.

With regards to the semiconductor device thus formed, leakage current between wirings is measured, and as the result there was no leakage current observed in the semiconductor device of the embodiments illustrated above.

(Fourth Embodiment)

Then, a wiring structure on the fourth embodiment of the present invention will be described. In the fourth embodiment the first insulation film and the second insulation film are made of the same material.

Figure 8A:
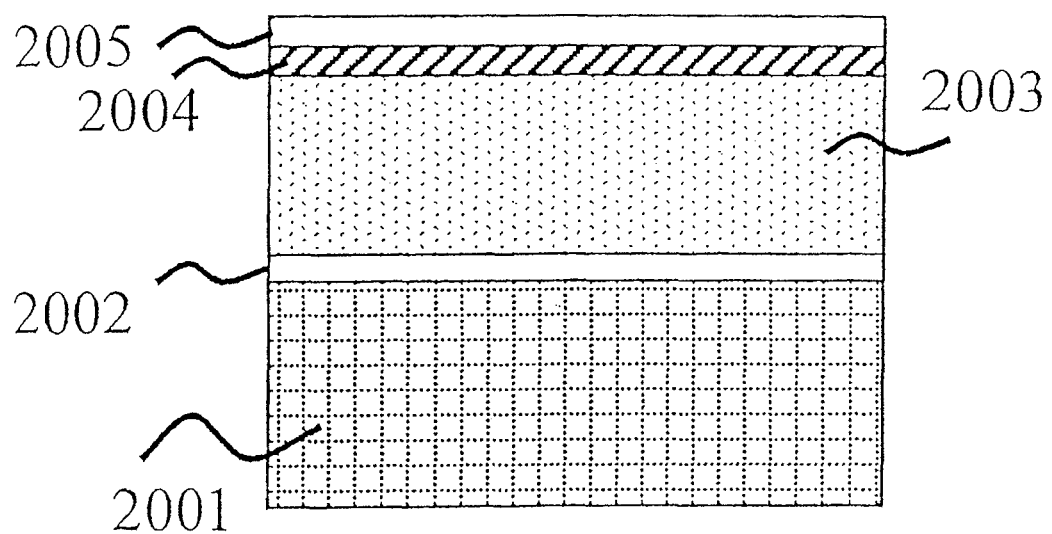
FIGS. 8A to 8F are partial and vertical cross sectional views showing a series of processes in a method for manufacturing a semiconductor device in accordance with a fourth embodiment of the present invention.

As illustrated in FIG. 8A, there is formed the via interlayer insulation film 2001 made of the third insulation film on a substrate (not shown) forming a semiconductor element. On the via interlayer insulation film 2001 there are laminated the etch stop film 2002 made of the fourth interlayer insulation film with 30 nm, the porous insulation film 2003, the second insulation film 2004 and the fifth interlayer insulation film 2005.

In the description below, the first insulation film and the fourth insulation film are inscribed on the surface such as a cap film and an etch stop film respectively, in accordance with each role.

In the case the etch stop film 2002 and the fifth interlayer insulation film 2005 are $SiO_2$ formed by the CVD method. The porous insulation film (the film with a low dielectric constant) 2003 is the porous SiOCH film (Aurora ULK™) having the relative dielectric constant of 2.5 formed by the CVD method. The second insulation film 2004 is the SiCN film formed by the CVD method. In this embodiment there is provided with a lamination hard mask structure in which the fifth interlayer insulation film 2005 lies on the second insulation film 2004. The fifth interlayer insulation film 2005 is utilized as a dummy layer so that the process controllability is improved, and a wiring structure can be achieved with the same material for the first insulation film and the second insulation film 2004.

Figure 8B:
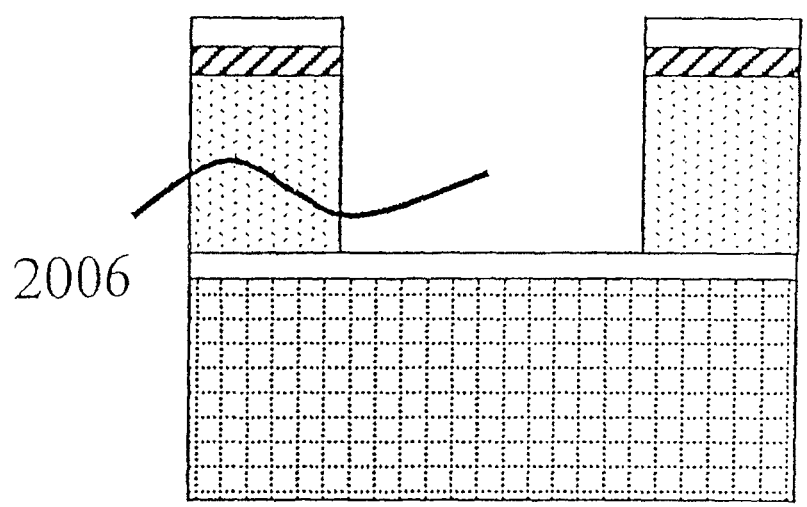

Then, as illustrated in FIG. 8B, a damascene wiring trench 2006 is formed in the interlayer insulation film using photo resist and reactive ion etching.

Figure 8C:
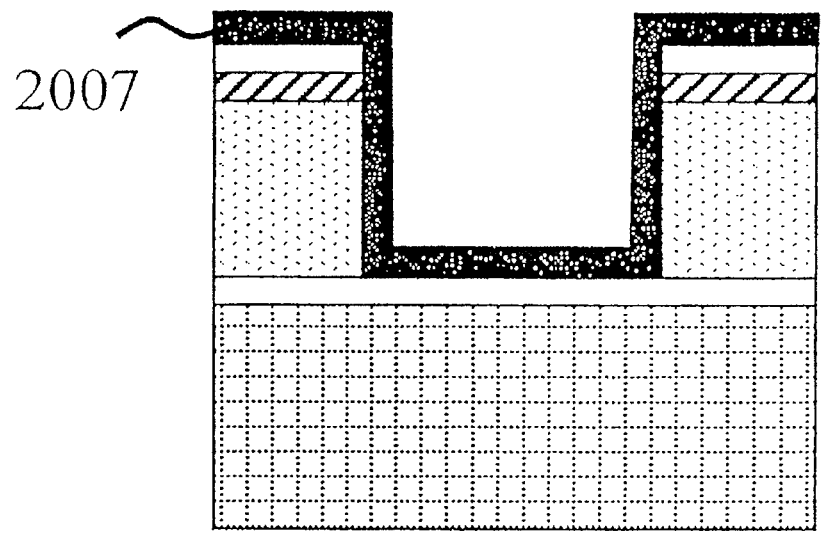

Then, as illustrated in FIG. 8C, an insulation barrier layer 2007 made of the BCB is formed on whole surface, namely, the upper surface of the $SiO_2$ film 2005, the side and the bottom surfaces of the wiring trench 2006.

Figure 8D:
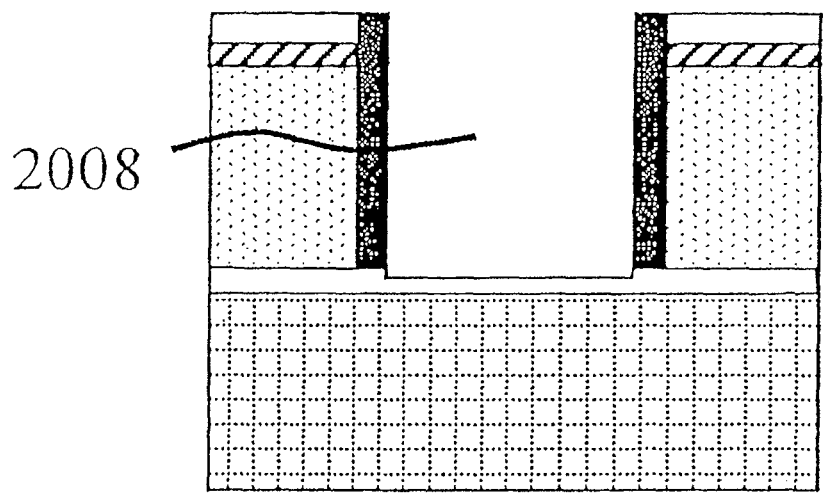

Then, as illustrated in FIG. 8D, the BCB film 2007 is etched back and the wiring trench 2008 is opened using the method described above in the first embodiment. In the case, the BCB film 2007 formed in the side surface of the damascene wiring trench 2006 remains without removing. Also, in the case the second insulation film 2004 remains without removing because it is protected by the fifth interlayer insulation film 2005.

Figure 8E:
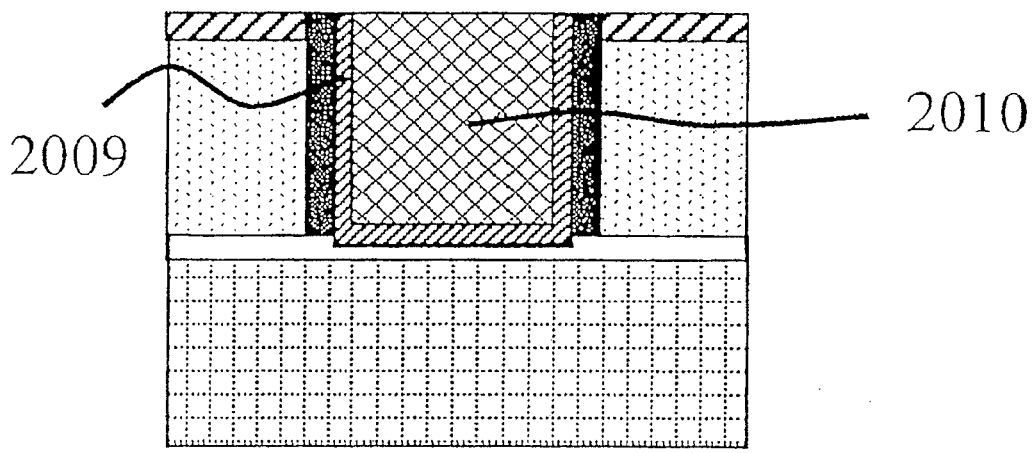

Then, as illustrated in FIG. 8E, the Cu film 2010 is embedded, which is enclosed by the Ta/TaN barrier metal 2009. In the case, the method of embedding Cu is such that the Cu film with 100 nm formed as a seed layer by the PVD method is embedded using the MOCVD method.

Consecutively, surplus Cu film 2010 is removed by the CMP method. In the case, the SiCN film 2004 which is the second insulation film functions as a protecting film when removing the surplus Cu film, thereby preventing exposure of the porous insulation film (Aurora ULK™) 2003.

Figure 8F:
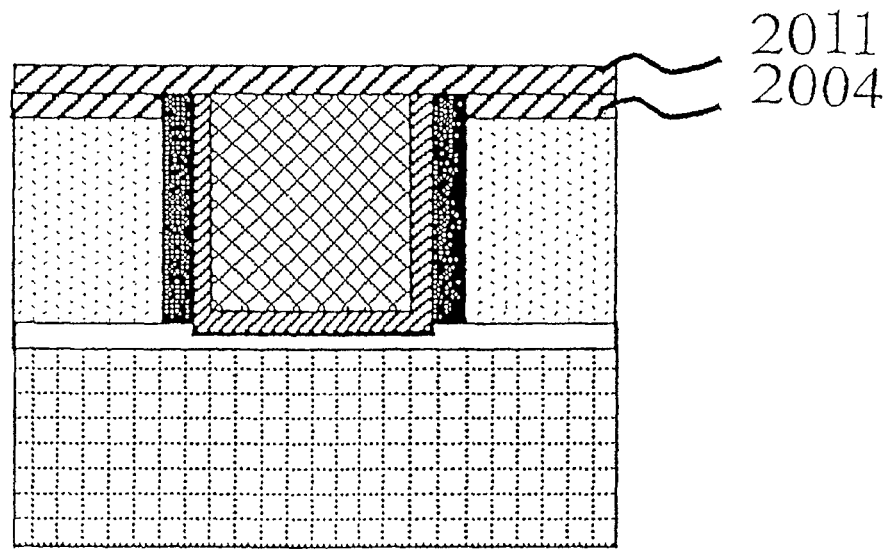

Then, as illustrated in FIG. 8F, consecutively a SiCN film 2011 which is the first insulation film is formed with 50 nm, thereby achieving the damascene Cu wiring. In the case, the insulation credibility between wirings can be elevated because the second insulation film 2004 and the SiCN film 2011 of the first insulation film are made of the same SiCN.

(Fifth Embodiment)

Then, a wiring structure on the fifth embodiment of the present invention will be described. In the fifth embodiment the etch stop film and the via interlayer insulation film are made of the same material.

Figure 9A:
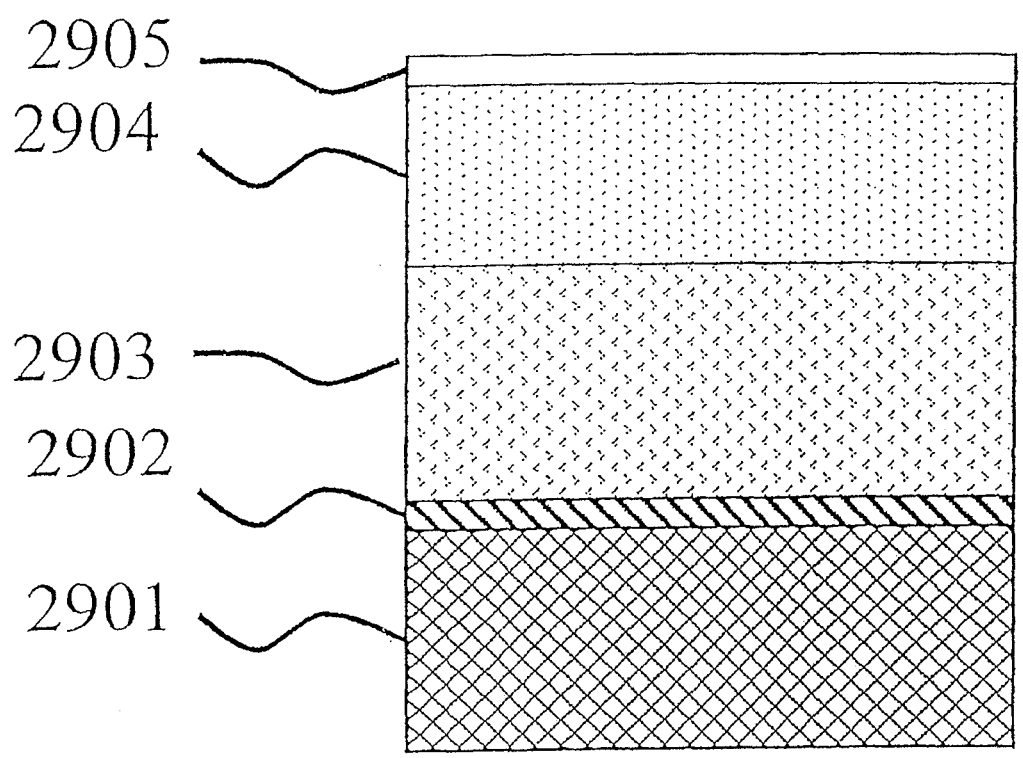
FIGS. 9A to 9F are partial and vertical cross sectional views showing a series of processes in a method for manufacturing a semiconductor device in accordance with a fifth embodiment of the present invention.

As illustrated in FIG. 9A, on the substrate (not shown) forming a semiconductor element there is formed a first Cu film 2901 on which a SiCN film 2902 is formed. Further, there is laminated a via interlayer insulation film 2903 on the SiCN film 2902, and there is deposited a porous insulation film 2904 on the via interlayer insulation film 2903. Then, there is formed a $SiO_2$ film 2905 on the porous insulation film 2904.

In this embodiment, carbon content quantity included in the via interlayer insulation film 2903 is controlled so that a selection ratio for etching can be secured without inserting the etch stop film.

The via interlayer insulation film 2903 is made of nonporous material with a relative dielectric constant in the vicinity of 3.0, for example, such as $SiO_2$, HSQ and SiOCH (Black Diamond™ and so on), and the porous insulation film 2904 is such as, for example, a porous SiOCH film or an insulating thin film including organic substance therein.

Figure 9B:
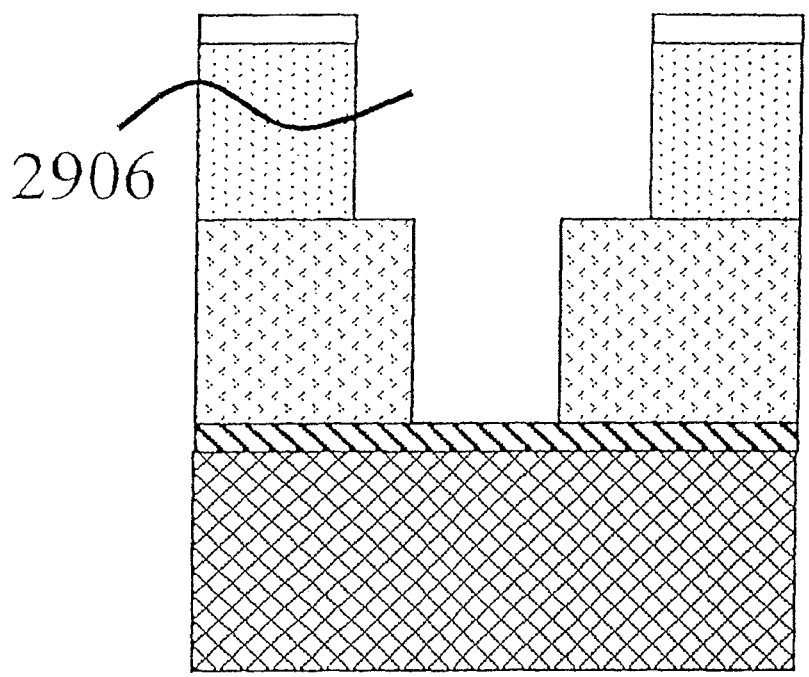

Then, as illustrated in FIG. 9B, a dual damascene wiring trench 2906 is formed in the interlayer insulation film using photo resist and reactive ion etching.

Figure 9C:
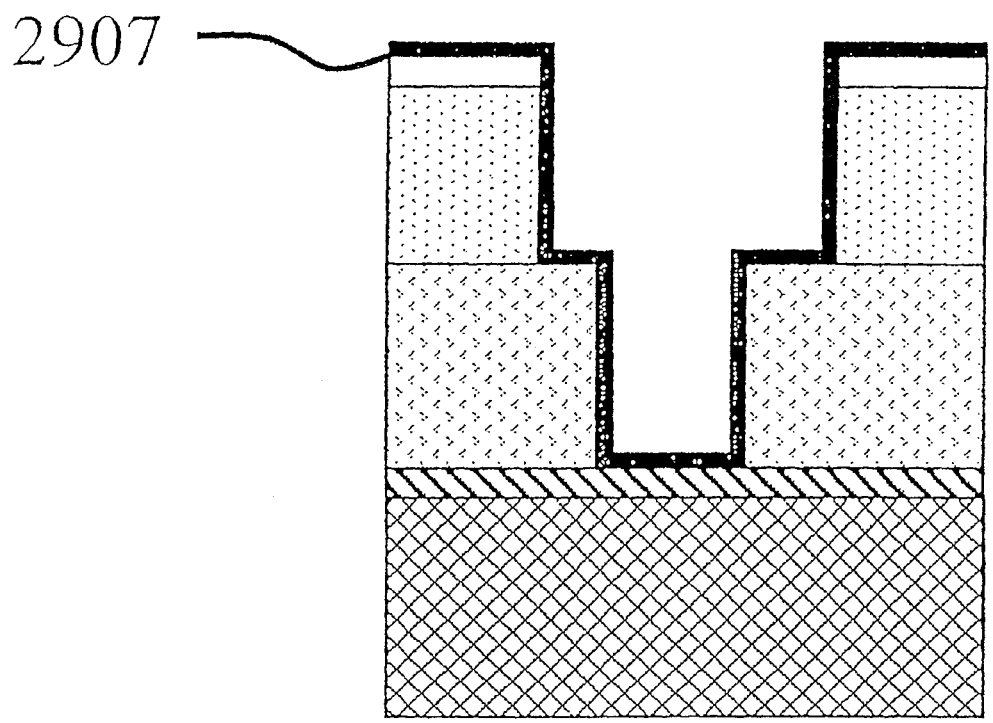

Then, as illustrated in FIG. 9C, an BCB film 2907 of the insulation barrier layer is formed on whole surface, namely, the upper surface of the $SiO_2$ film 2905, the side surface of the wiring trench 2906 and the upper surfaces of the cap film 2902 and the via interlayer insulation film 2903.

Figure 9D:
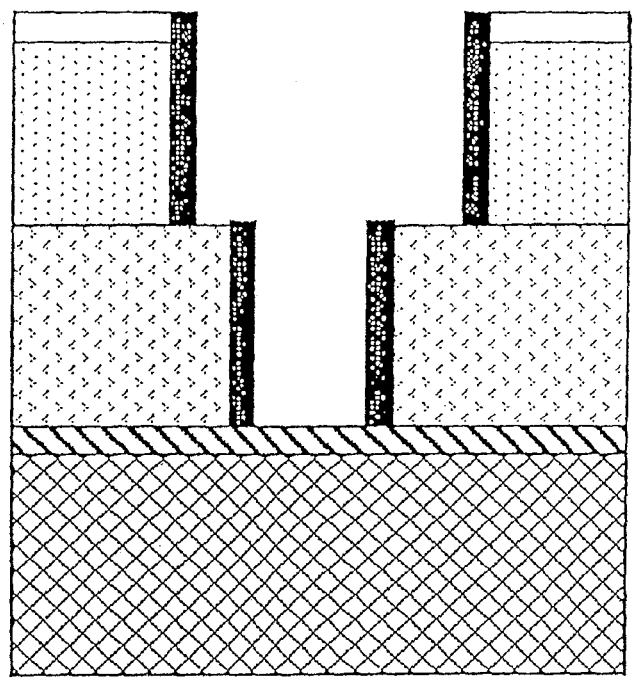
Figure 9E:
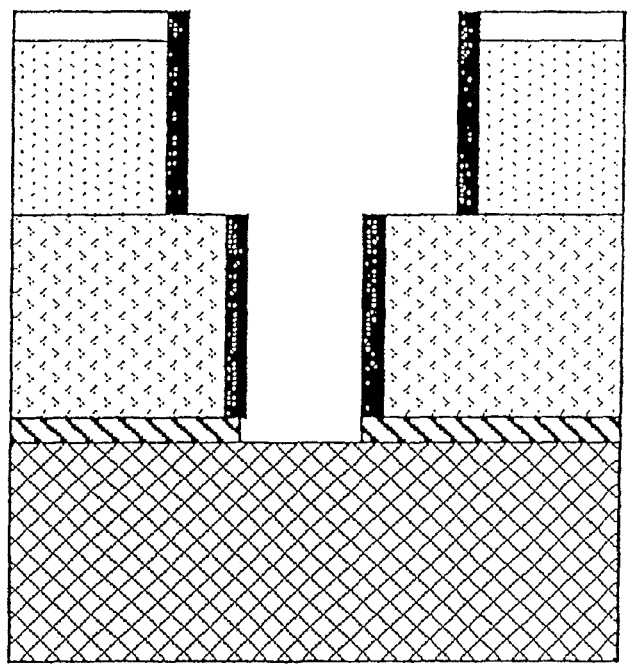

Then, as illustrated in FIG. 9D, the BCB film 2907 is etched back and then the cap film 2902 is etched, as illustrated in FIG. 9E. In the case a preferable etching of the cap film 2902 for controlling process performance of the fine wiring is to selectively remove only the cap film 2902 at the via bottom without exposing the upper surface of the porous insulation film 2904.

Material for the optimal insulation barrier to form the insulation barrier layer in the side surface of the porous insulation film is the material in which carbon content quantity included in the insulation barrier layer is much more than that of the hard mask film 2906, the via interlayer insulation film 2903 and the cap film 2902, and which is able to elevate the selection ratio in etching. In this embodiment case, carbon content quantity included in the via interlayer insulation film 2903 is reduced, so that the selection ratio in etching can be secured even in the absence of the etch stop film.

Figure 9F:
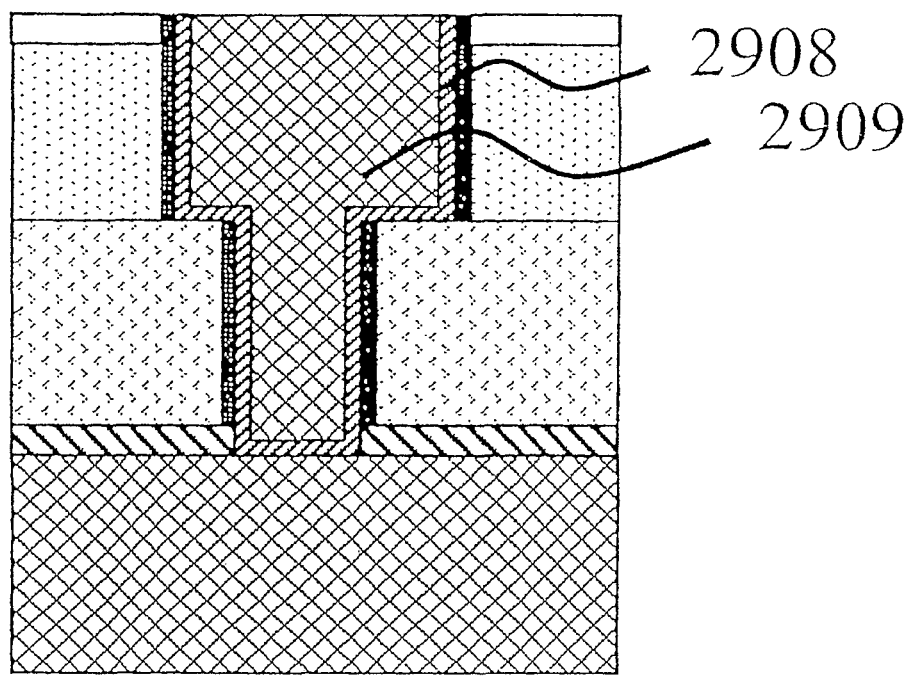

Then, as illustrated in FIG. 9F, a second Cu film is embedded in the formed wiring trench, and a Cu wiring 2909 is formed, which is enclosed by the barrier metal 2908. In the case, the lamination layer of PVD-Ta/TaN is utilized as the barrier metal 2908.

The wiring is formed using the method of embedding Cu in which a Cu seed layer including Al of 0.1 to 1.0 wt % by the PVD method is formed, then Cu is embedded on the whole surface and then surplus Cu and the barrier metal is removed by the method of Cu-CMP.

Thus, without deteriorating wiring performance, the elevation on the insulation credibility between wirings can be achieved, thereby enabling to manufacture a semiconductor product with high yield.

(Sixth Embodiment)

Then, a wiring structure on the sixth embodiment of the present invention will be described. In the sixth embodiment, the effect of protecting the porous film through Benzo Cyclobutene is confirmed.

The experimental result in the lamination films will be explained in case that the insulation barrier layer inserted between the metal wiring and the interlayer insulation film is the Benzo Cyclobutene (BCB) film formed by the plasma polymerization method, which is above described in the first to fifth embodiments.

Figure 10A:
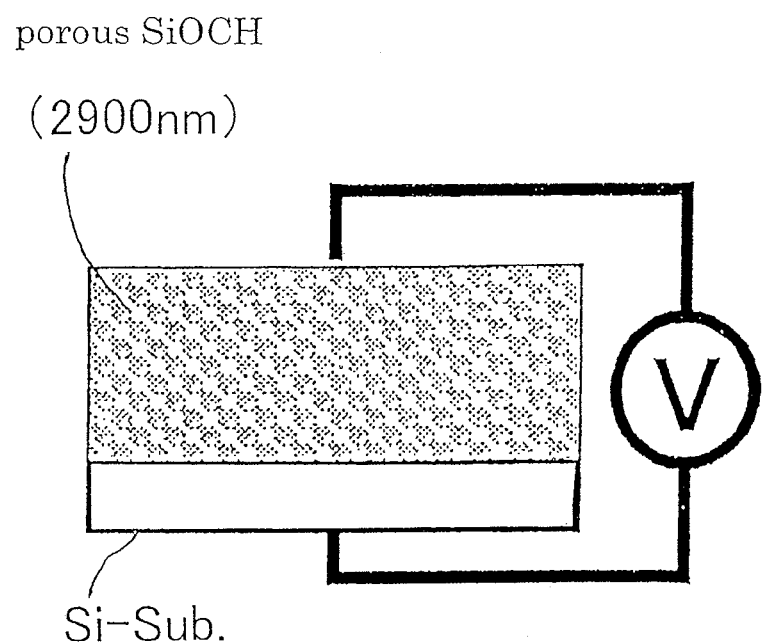
FIG. 10A is a schematic representation showing a cross section structure of a first sample for measuring leakage current of a semiconductor device in accordance with a sixth embodiment of the present invention.
Figure 10B:
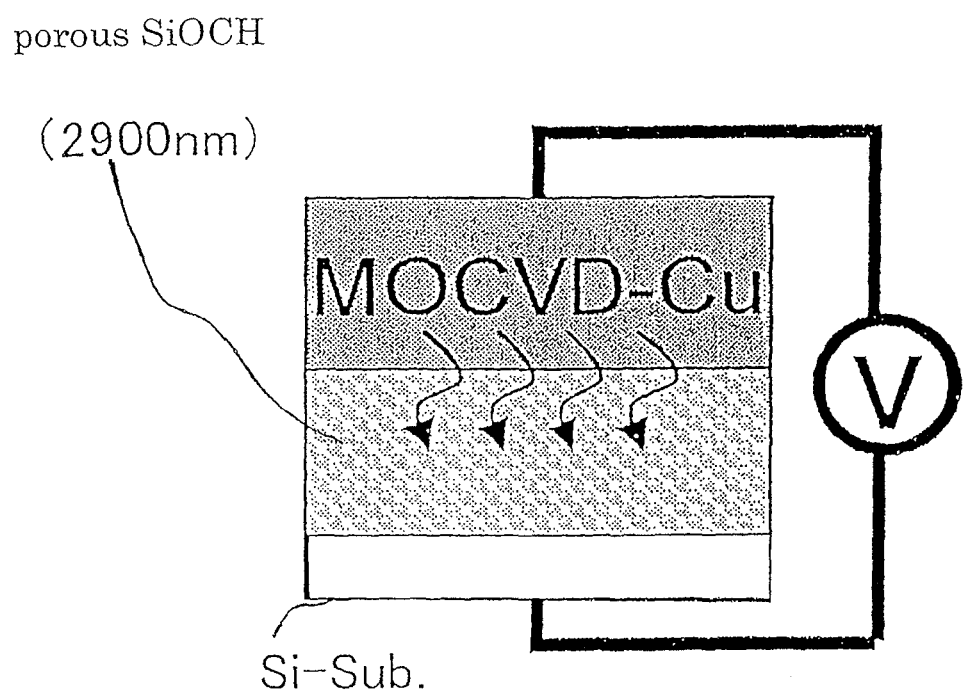
FIG. 10B is a schematic representation showing a cross section structure of a second sample for measuring leakage current of a semiconductor device in accordance with a sixth embodiment of the present invention.
Figure 10C:
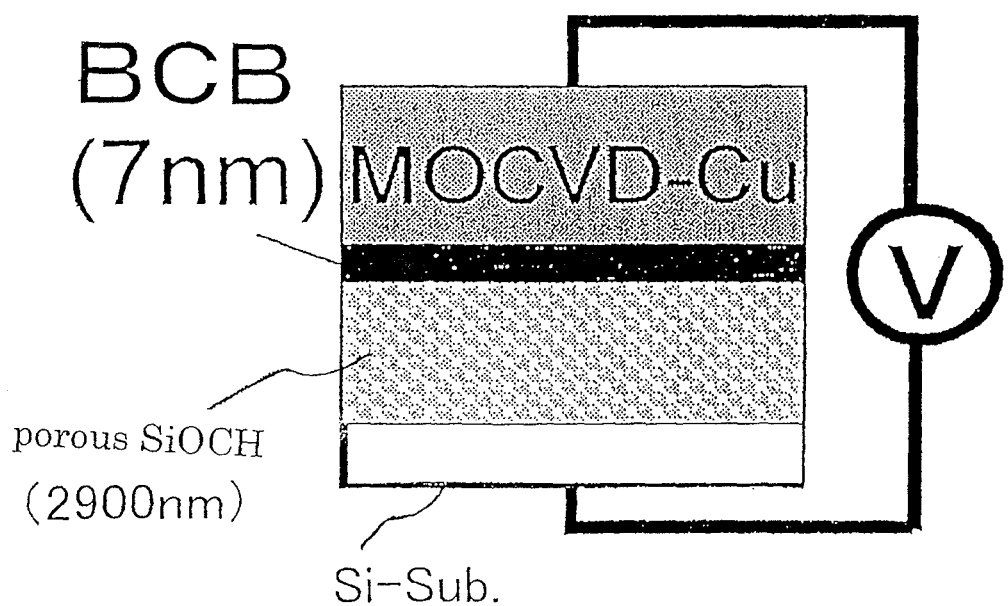
FIG. 10C is a schematic representation showing a cross section structure of a third sample for measuring leakage current of a semiconductor device in accordance with a sixth embodiment of the present invention.

FIG. 10A shows the structure in which only porous SiOCH film is formed on the silicon substrate by the CVD method. FIG. 10B shows the structure in which Cu is formed on the porous SiOCH film by the MOCVD method. FIG. 10C shows the structure in which the BCB film with the film thickness of 7 nm formed by the plasma polymerization method is inserted between the MOCVD-Cu and the porous SiOCH film.

The Cu film with 300 nm in film thickness is formed under the conditions that the substrate temperature is 200 and the pressure is 100 Pa, utilizing Cupraselect Brend™ as the raw material for the MOCVD-Cu and hydrogen as the carrier gas. To evaluate severely the porous SiOCH film with regards to any samples, heat treatment, after forming the sample, was made in the atmosphere of nitrogen for 30 minutes at the temperature of 360.

Figure 11:
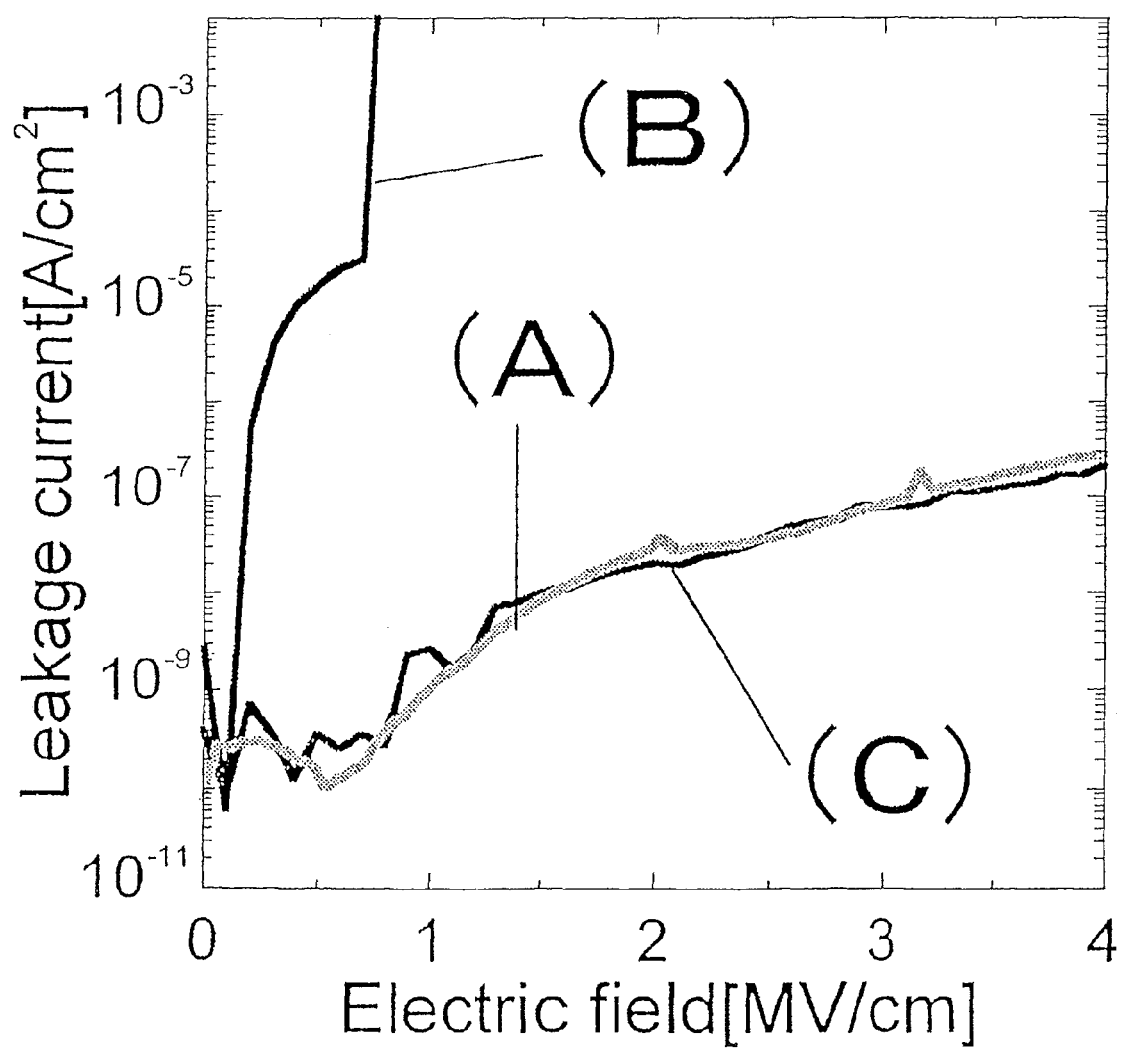
FIG. 11 is a graph showing measurement result of leakage current corresponding to the first to the third samples illustrated in FIG. 10A to FIG. 10C, of a semiconductor device in accordance with a sixth embodiment of the present invention.

FIG. 11 shows the result of measurement with regards to leakage current of each sample corresponding to the FIG. 10A to FIG. 10C. In the structure illustrated in FIG. 10A, the film leak level is achieved low enough. On the contrary, in the structure illustrated in FIG. 10B in which the MOCVD-Cu is formed directly on the porous SiOCH film, the leak level rises remarkably so that insulation property deteriorates. In the structure illustrated in FIG. 10C in which the BCB film of the insulation barrier is inserted between the porous SiOCH film and the MOCVD-Cu, the film leakage current is achieved low enough corresponding to the structure illustrated in FIG. 10A without rising.

Further, according to the observation of the cross section of the sample by the transmission electron microscope (TEM), in the structure illustrated in FIG. 10B, the boundary face is not clear between the porous SiOCH film and the MOCVD-Cu. On the contrary, in the structure illustrated in FIG. 10C, the BCB film with thickness of 7 nm is confirmed, and it is confirmed that the layer of the porous SiOCH film and the layer of the MOCVD-Cu are clearly separated From here onwards, it is apparent that the BCB film prevents raw material of the MOCVD-Cu from penetrating into the porous SiOCH film, and prevents Cu metal from diffusing to the porous SiOCH film, and therefore it can be seen that the BCB film is necessary and sufficient as the insulation barrier layer to protect the porous film surface.

Accordingly, there is no diffusion of the barrier metal to the porous SiOCH film even if WN film by the CVD method or TaN film by the MOCVD method is utilized instead of this barrier metal, though in the above embodiments the PVD-Ta/TaN barrier metal film and so on are exampled. It is also apparent that no diffusion of the barrier metal to the porous SiOCH film is verified by the fact that there was no gas diffusion of Cu film by the MO-CVD method. It is preferably applicable to further miniaturization that good cladding property of the barrier metal leads to better embedding.

Further, the portion can be confirmed by the product. In the WN film, W and N can be specified by elemental analysis such as EDX and so on, in addition to TEM of the portion. In case of TaN by the MOCVD, C is detected in addition to Ta and N.

COMPARATIVE EXAMPLE 1

Referring to the drawings, the comparative example 1 will be explained below with regards to the embodiments above described of the present invention.

Figure 12A:
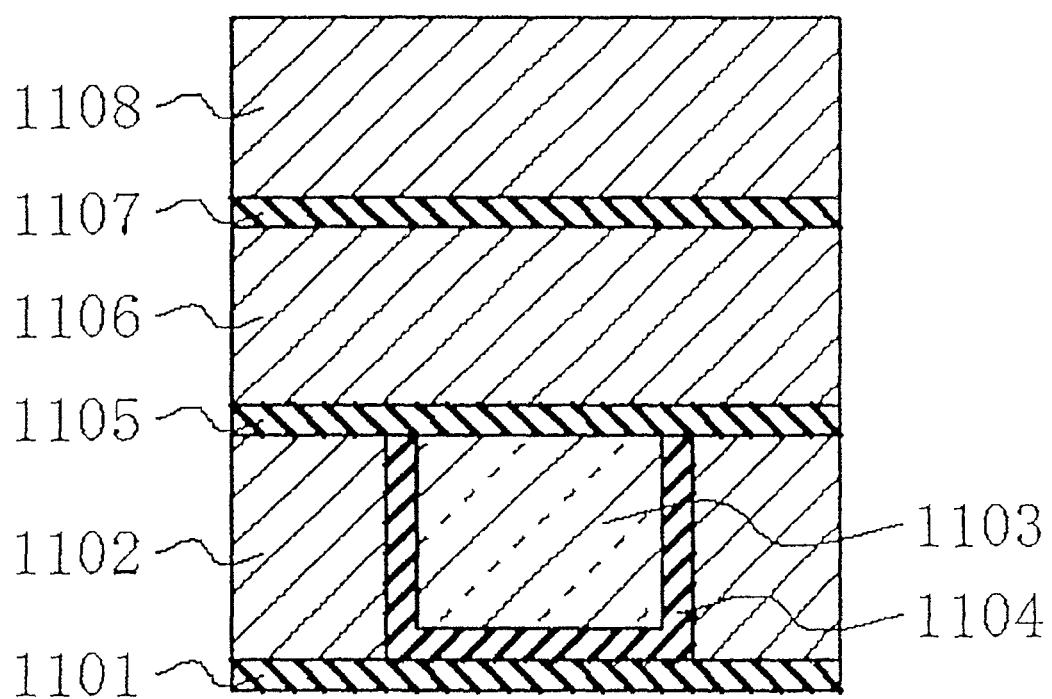
FIGS. 12A to 12D are partial and vertical cross sectional views showing a series of processes in a method for manufacturing a semiconductor device in accordance with a first comparative example.

As illustrated in FIG. 12A, there is formed an under layer Cu wiring structure made of the porous SiOCH film 1102, the barrier metal film 1104 and the first Cu wiring 1103, on the SiC film of the substrate (not shown) forming a semiconductor element. Further, there are formed the cap film 1105 made of SiCN, the porous SiOCH film 1106, the etch stop film 1107 and the porous SiOCH film 1108 by laminating thereon.

Figure 12B:
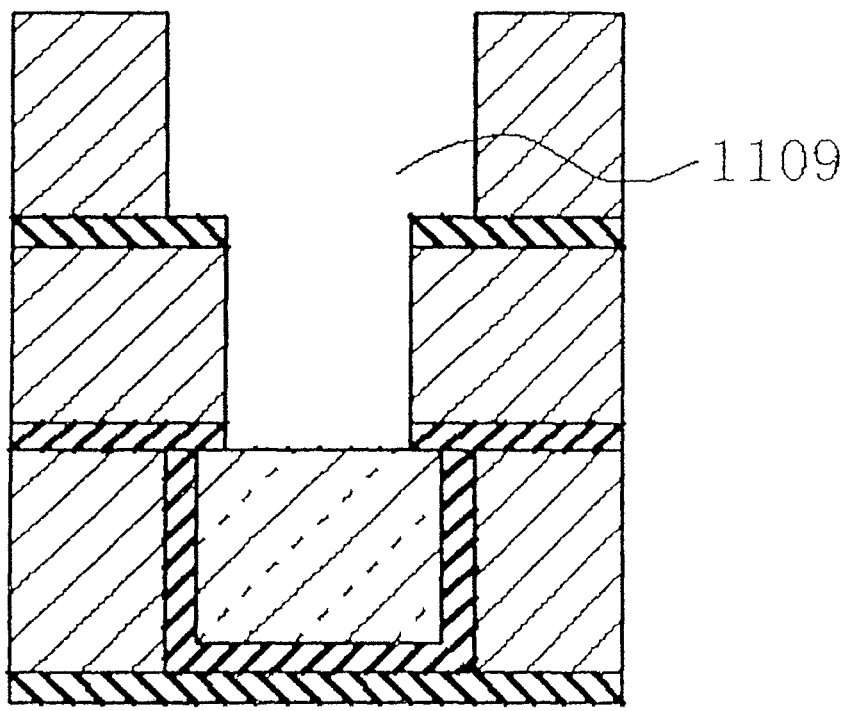

Then, as illustrated in FIG. 12B, there are formed a fine pattern using the photo lithography process, and a damascene wiring trench 1109 using the reactive ion etching and ashing processes.

Figure 12C:
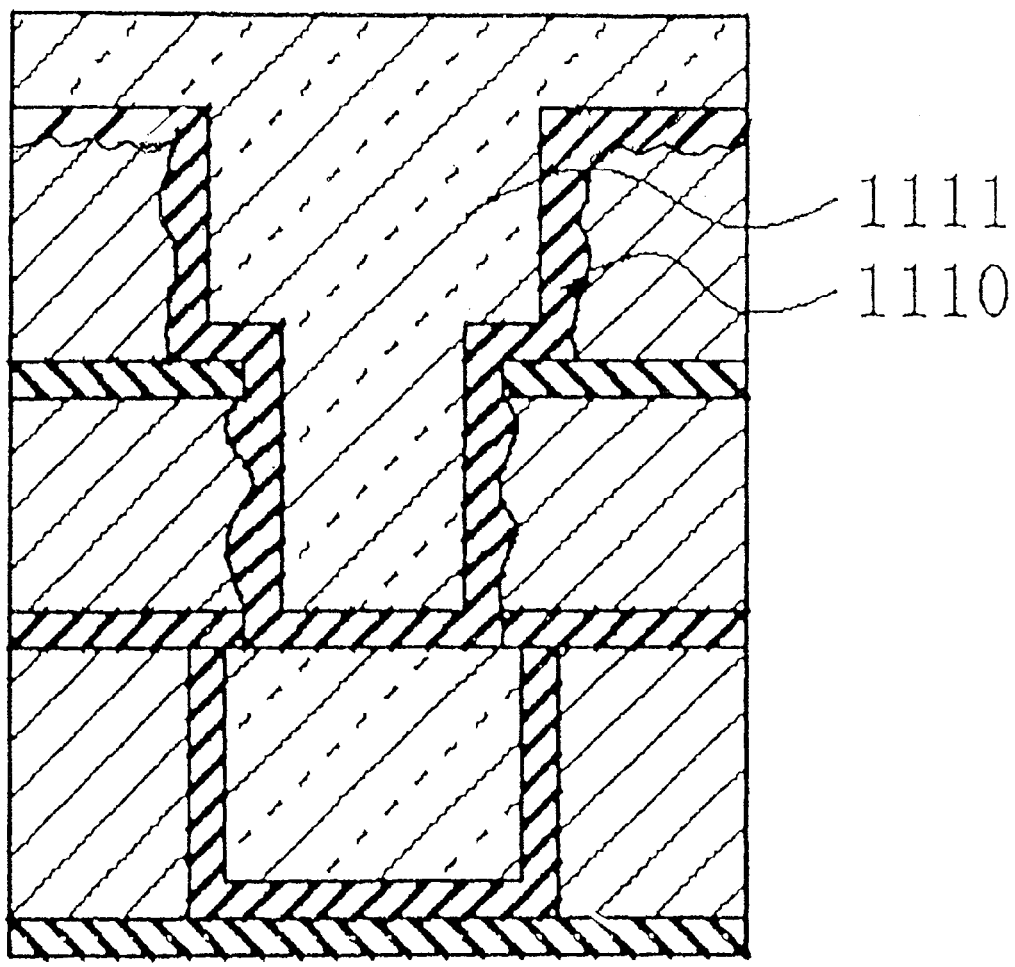

Then, as illustrated in FIG. 12C, there is formed the barrier metal film 1010 made of TaN on the whole surface using the CVD method. In the case, the TaN layer easily penetrates into the porous film, because of being formed by using gaseous raw material and forms the barrier metal layer inside the porous film. There is formed a Cu seed layer thereon by the PVD method. Then, there is deposited the Cu film 1111 by the electrolyte plating method.

Figure 12D:
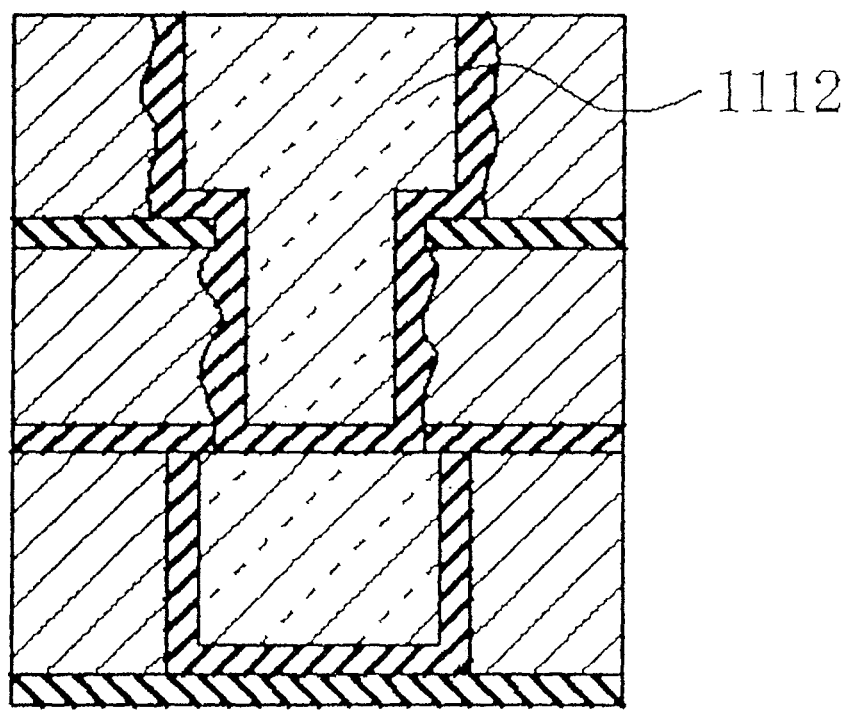

Then, as illustrated in FIG. 12D, there is formed the multi-layered wiring structure by removing the surplus barrier metal and Cu using the CMP. According to measurement of performance of the multi-layered wiring thus formed, occurrence of the leakage current is confirmed, which arises from the penetration of the barrier metal into the porous film.

COMPARATIVE EXAMPLE 2

Referring to the drawings, the comparative example 2 will be explained below with regards to the embodiments above described of the present invention.

Here, as the comparative example with the present invention, there is compared a multi-layered wiring structure in which the cap film made of the first insulation film and the hard mask film made of the second insulation film are not the same material. The forming process of the wiring is in accordance with the fourth embodiment illustrated in FIG. 8A to FIG. 8F.

Insulation property between the wirings is compared, in which the first insulation film corresponds to the SiC film, the SiN film and the SiCN film respectively, in case of the SiCN as the second insulation film.

Figure 13:
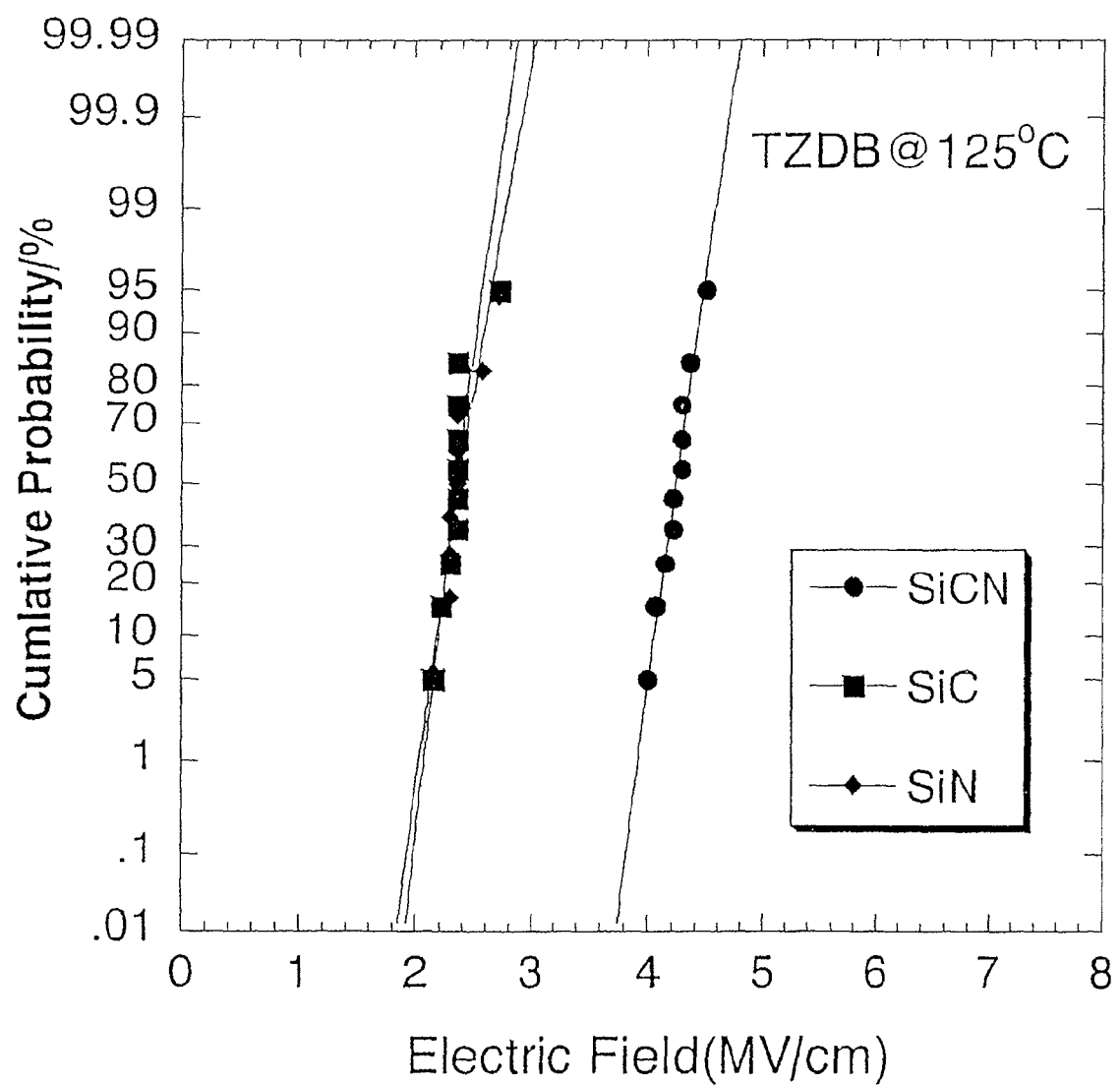
FIG. 13 is a graph showing a comparative result on initial dielectric strength voltage of each wiring structure.

FIG. 13 shows the comparative result with regards to the incipient withstand voltages in those wiring structures. It can be seen that electric field is 4 MV/cm in case of the SiCN film, that is relatively high, and electric field is 2 MV/cm in case of the SiC film and the SiN film, that is relatively low.

Figure 14:
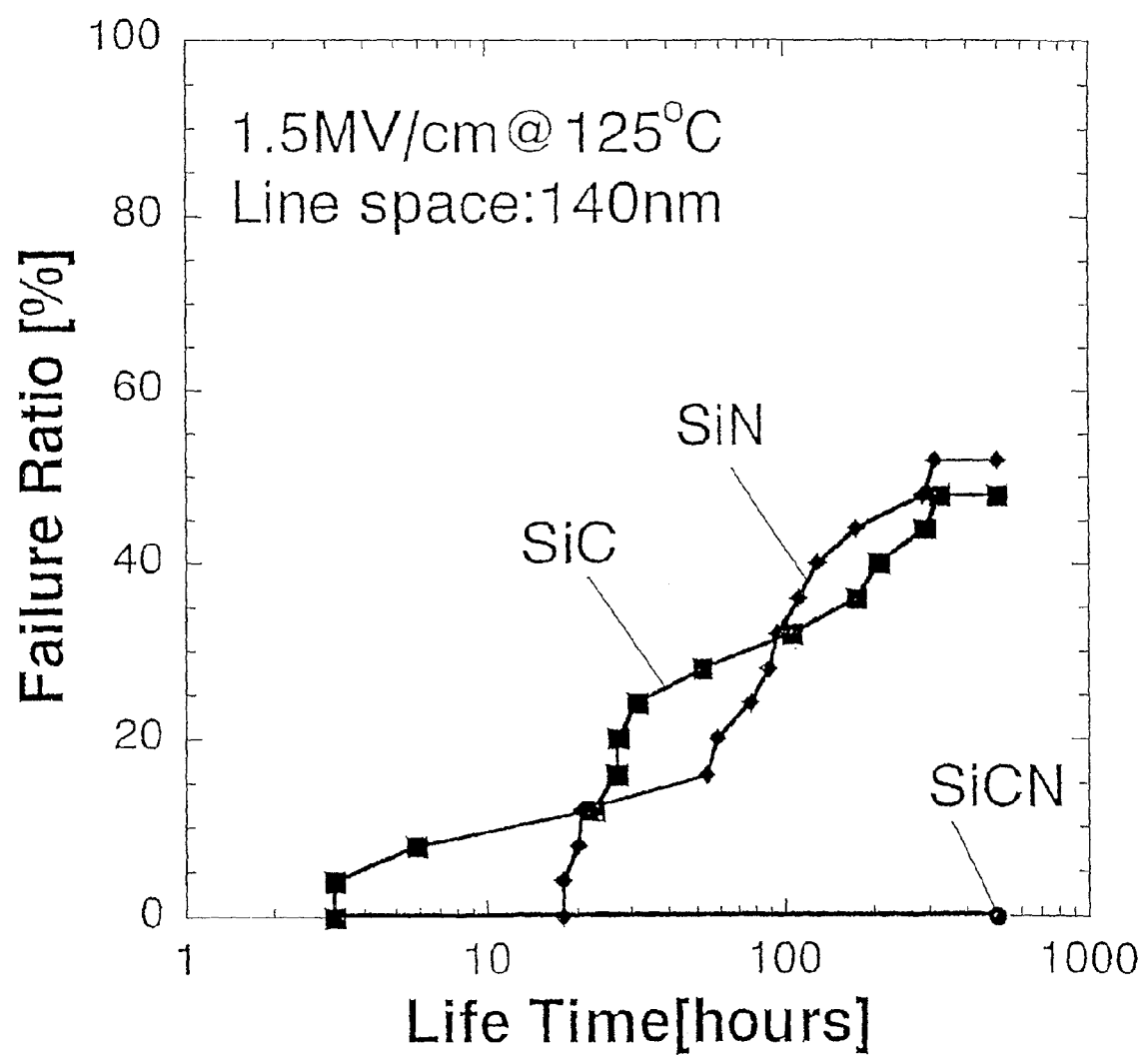
FIG. 14 is a graph showing a test result of TDDB (Time Dependent Dielectric Breakdown) between wirings.

FIG. 14 shows the test result with regards to TDDB (time dependent dielectric breakdown) between wirings. The stress of 1.5 MV/cm at the temperature of 150 is applied to the line space of 140 nm for 500 hours. Failure occurred in case of using the SiC film and the SiN film. On the contrary, there is no failure in case of using the SiCN film. Accordingly, an advantage could be confirmed, that the cap film made of the first insulation film and the hard mask film made of the second insulation film are the same.

According to the present invention as mentioned above, the insulation credibility can be elevated by introducing such a insulation barrier layer, in case of partial utilization of the porous insulation film in the interlayer insulation film. Accordingly, because the multi-layered wiring with high credibility can be formed by holding the capacitance between wirings to be low and holding the withstand voltage between wirings to be high, it is possible to provide a semiconductor device with high integrated circuit and a method for manufacturing the same.

It is apparent from the foregoing description that in the present invention, the insulation barrier layer including organic substance means a barrier layer of the type which has insulation and is constituted of material with organic substance as the main component, and the barrier layer so defined is greatly different from a barrier layer based on the electrically conductive material such as metal and so on, for example.

Possibility of Industrial Utilization

The present invention is applicable to all things, as long as it is concerned with a wiring structure and a method of manufacturing the same for the multi-layered wirings which is constituted of the trench wiring structure utilizing a film having a dielectric constant lower than that of the silicon oxidation film as the interlayer insulation film, and accordingly, there is no limitation to the possibilities for application thereof.

Several preferred embodiments were described with regards to the present invention. But, those should be interpreted as only the example for explaining the present invention by illustrating, and the present invention should not be interpreted as any limitations to those embodiments It is apparent that many modifications and substitutions could be done by a person ordinary skilled in the art using constituent elements and skills equivalent to the present invention, after he knew the specification of this invention, and those modifications and substitutions are included in the scope and gist of the claims attached.

What is claimed is:

1. A method for manufacturing a multi-layered wiring in which a plurality of unit wiring structures are laminated, the unit wiring structure having a wiring and a connection plug formed by filling metal including Cu as a main component into a wiring trench and a via hole formed in an insulation film on a substrate forming a semiconductor element, the method comprising:
    forming a first insulation film directly contacting on the copper wiring or the copper connection plug and a porous insulation film laid on the first insulation film,
    forming a second insulation film laid on the porous insulation film,
    forming a wiring trench or a via hole in the second insulation film and the porous insulation film, such that a bottom of the wiring trench or the via hole is comprised entirely of an upper surface of the first insulation film,
    forming an insulation barrier layer including organic substance at upper surface, side surface and bottom surface of a wiring structure sectioned by the wiring trench or the via hole,
    etching back the insulation barrier layer including organic substance and removing the insulation barrier layer including organic substance remaining on the upper surface and bottom surface portions of the wiring structure, and
    embedding a metal film in the wiring structure trench or the via hole,
    wherein the insulation barrier layer includes silicon atoms with a silicon content of less than 3 atm %, and wherein the silicon content of the insulation barrier layer is smaller than a silicon content of the first insulation film and a silicon content of the second insulation film.

2. The method for manufacturing a multi-layered wiring according to the claim 1 wherein said insulation barrier layer including the organic substance is formed by the plasma polymerization method.

3. The method for manufacturing a multi-layered wiring according to claim 1, wherein a carbon content of the insulation barrier layer including the organic substance is 40 atm %, and at the same time, a carbon content of the first insulation film is less than 30 atm % and a carbon content of the second insulation film is less than 10atm %.

4. A method for manufacturing a multi-layered wiring in which a plurality of unit wiring structures are laminated, the unit wiring structure having a wiring and a connection plug formed by filling metal including Cu as a main component into a wiring trench and a via hole formed in an insulation film on a substrate forming a semiconductor element, the method comprising:
    forming a first insulation film, a third insulation film, a porous insulation film and a second insulation film by laminating in series on a copper wiring,
    forming a wiring trench in the porous insulation film and the second insulation film,
    forming a via hole in the third insulation film, such that a bottom of the via hole is comprised entirely of an upper surface of the first insulation film,
    forming an insulation barrier layer including organic substance at upper surface, side surface and bottom surface of the wiring structure sectioned by the wiring trench and the via hole,
    etching back the insulation barrier layer including organic substance and removing the insulation barrier layer including organic substance remaining on the upper surface and bottom surface of the wiring structure,
    removing the first insulation film on the bottom of the via hole in the wiring structure, and
    embedding a metal film in the wiring trench and the via hole,
    wherein the insulation barrier layer includes silicon atoms with a silicon content of less than 3 atm %, and wherein the silicon content of the insulation barrier layer is smaller than a silicon content of the first insulation film and a silicon content of the second insulation film.

5. The method for manufacturing a multi-layered wiring according to the claim 4 wherein said insulation barrier layer including the organic substance is formed by the plasma polymerization method.

6. The method for manufacturing a multi-layered wiring according to the claim 4,
    further comprising forming a fourth insulation film by laminating in series after the third insulation film and before the porous insulation film,
    wherein the via hole formed in the third insulation film is formed through the fourth insulation film and the third insulation film.

7. The method for manufacturing a multi-layered wiring according to claim 4, wherein a carbon content of the insulation barrier layer including the organic substance is 40 atm %, and at the same time, a carbon content of the first insulation film is less than 30 atm % and a carbon content of the second insulation film is less than 10atm %.

* * * * *